United States Patent
Satou et al.

(10) Patent No.: US 7,119,363 B2
(45) Date of Patent: Oct. 10, 2006

(54) THIN FILM TRANSISTOR FORMED ON A TRANSPARENT SUBSTRATE

(75) Inventors: Yoshinobu Satou, Tokyo (JP); Katsuhisa Yuda, Tokyo (JP); Hiroshi Tanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/911,833

(22) Filed: Aug. 5, 2004

(65) Prior Publication Data

US 2005/0012098 A1    Jan. 20, 2005

Related U.S. Application Data

(62) Division of application No. 10/457,928, filed on Jun. 9, 2003, now Pat. No. 6,822,263, which is a division of application No. 09/713,960, filed on Nov. 16, 2000, now abandoned.

(30) Foreign Application Priority Data

Nov. 18, 1999    (JP) .................................. 11-328211

(51) Int. Cl.
    *H01L 29/04*    (2006.01)
(52) U.S. Cl. ............................. 257/49; 257/52; 257/57; 257/62
(58) Field of Classification Search ................. 257/49, 257/52, 57, 62
    See application file for complete search history.

(56) References Cited

U.S. PATENT DOCUMENTS

| | | | |
|---|---|---|---|
| 4,678,282 A | 7/1987 | Yaniv et al. | |
| 4,867,537 A | 9/1989 | Aoki et al. | |
| 5,821,562 A | 10/1998 | Makita et al. | |
| 6,759,628 B1 * | 7/2004 | Ino et al. ................. | 219/121.8 |

| | | |
|---|---|---|
| 2002/0175888 A1 | 11/2002 | Murade |

FOREIGN PATENT DOCUMENTS

| | | |
|---|---|---|
| JP | 198546 | 11/1985 |
| JP | 62-109026 | 5/1987 |
| JP | 63-292619 | 11/1988 |
| JP | 01-116526 | 5/1989 |
| JP | 04-186725 | 7/1992 |
| JP | 04206572 | 7/1992 |
| JP | 05-326369 | 12/1993 |
| JP | 6-163590 | 6/1994 |
| JP | 07-193247 | 7/1995 |
| JP | 07-302912 | 11/1995 |
| JP | 07-321012 | 12/1995 |
| JP | 09-191114 | 7/1997 |
| JP | 09-246564 | 9/1997 |
| JP | 409283765 | 10/1997 |
| JP | 10-012891 | 1/1998 |
| JP | 10-041523 | 2/1998 |
| JP | 11-087729 | 3/1999 |

OTHER PUBLICATIONS

Japanese Office Action dated Jan. 11, 2005 with partial translation.

* cited by examiner

*Primary Examiner*—Long Pham
(74) *Attorney, Agent, or Firm*—Katten Muchin Rosenman LLP

(57) ABSTRACT

A thin-film transistor is formed on a transparent substrate and has a gate electrode film layer and a source and drain regions, and further has an alignment mark made of one and the same constituent material as a constituent material of at least one of the gate electrode film layer and source and drain regions and formed at one and the same position as the gate electrode film layer or source and drain region.

7 Claims, 18 Drawing Sheets

THIN FILM TRANSISTOR FORMED ON A TRANSPARENT SUBSTRATE

CROSS-REFERENCE TO RELATED APPLICATION

This is a Divisional Application of application Ser. No. 10/457,928, filed Jun. 9, 2003, U.S. Pat. No. 6,822,263, which is a Divisional Application of application Ser. No. 09/713,960, filed Nov. 16, 2000, abandoned.

BACKGROUND OF THE INVENTION

1. Field of the Invention

The invention relates to a thin-film transistor, a thin-film transistor manufacturing apparatus, and a method for manufacturing a thin-film transistor, and more particularly it relates to a thin-film transistor and a method for manufacturing a thin-film transistor wherein it is possible to accurately and efficiently position constituent elements of a semiconductor device, and to an electronic apparatus using a thin-film transistor such as an image sensor or an LCD display.

2. Description of the Related Art

In the past, amorphous silicon thin-film transistors (TFTs) are known as being used as semiconductor devices in input and output apparatuses of contact-type image sensors.

In recent year, an increase in the amount of information and the resultant demand for high resolution and high performance from compact, lightweight portable terminals has focused attention on the polysilicon thin-film transistors. A polysilicon thin-film transistor has higher mobility than an amorphous thin-film transistor, and enables peripheral drive circuitry to be fabricated on one and the same substrate.

The manufacturing processes used for polysilicon thin-film transistors can be classified as high-temperature polysilicon, manufactured at the highest temperatures, and low-temperature polysilicon. High-temperature polysilicon involve process temperatures exceeding 1000° C., and low-temperature polysilicon involve process temperatures below approximately 600° C.

In contrast to high-temperature polysilicon, the manufacturing of which requires the use of a high-cost fused silica substrate having a high distortion point, low-temperature polysilicon can be manufactured using a low-cost alkaline glass having a low distortion point.

This is because by using an excimer laser method to crystallize the silicon film that serves as the activated layer, it is possible to achieve a low-temperature process. It is possible to form a high-performance transistor in this manner on a low-cost glass substrate. In crystallizing a silicon thin film, it is generally necessary to use an energy of approximately 200 to 500 mJ/cm$^2$ per pulse.

At this level of illumination, in order to illuminate an entire substrate measuring approximately 400 by 500 mm, it is necessary to have a unit pulse intensity of approximately 1 kJ/pulse, and practical laser light sources have an intensity of 1 J/pulse.

Therefore, laser crystallization is performed by sequential scanning of a beam formed on an area measuring approximately 150 by 0.4 mm, in which case, the existence of an intensity profile across the beam causes variations in the crystallized polysilicon film, particularly in the scanning direction.

One method that can be envisioned for solving this problem is that of shining the laser light locally. For example, considering the case in of an LCD display apparatus incorporating an integrated drive circuit, the region which requires a high-performance thin-film transistor is only the region of the drive circuit. Thus, it is sufficient to shine the laser locally on only the drive circuit region.

A method such as noted above is disclosed in the Japanese Unexamined Patent Publication (KOKAI) No. 9-246564 and the Japanese Unexamined Patent Publication (KOKAI) No. 62-109026. According to the Japanese Unexamined Patent Publication (KOKAI) No. 9-246564 in particular, a liquid-crystal display device is manufactured, wherein a semiconductor layer in the drive circuit region is exposed to laser light, so as to form a polysilicon thin-film transistor by localized crystallization, and an amorphous thin-film transistor is formed in a pixel-switching region.

In the Japanese Unexamined Patent Publication (KOKAI) No. 7-193247 there is a disclosure of a method for exposing a region in which an element is formed by only the uniform part of the beam profile.

In this method, after laminating a semiconductor layer and an oxide film in a planar thin-film transistor and forming an alignment mark on for laser exposure on the oxide film upper layer, on the uniform beam profile part of a beam is shined onto the element formation region, using this alignment mark as a reference.

The method of using an alignment mark as a guide has the advantage of good positioning accuracy. This advantage is suitable for use in local laser exposure, as advances are made in the density and compactness of transistors.

In the technology disclosed in the Japanese Unexamined Patent Publication (KOKAI) No. 7-193247, however, it is necessary to have separate patterning process steps for form the alignment mark, these being divided into exposure, developing, etching, resin peeling, and washing process steps, and the need to have an added lithography mask just for the purpose of forming the alignment mark.

Additionally, it is necessary to have a final step of removing the oxide film that serves as the alignment mark, using a wet process.

For this reason, impurities can become attached to the surface of the crystallized silicon film, leading to a worsening of element characteristics. In this type of process, the increase in the number of process steps not only lowers the throughput, but also has the problem of only enabling the achievement of a transistor with worsened characteristics, caused by contamination and the like.

In addition to the above-noted related art, in the Japanese Unexamined Patent Publication (KOKAI) No. 9-191114, there is a disclosure of a conventional method of manufacturing a thin-film transistor, although there is no disclosure of the manufacturing of a thin-film transistor using an alignment mark.

In the Japanese Unexamined Patent Publication (KOKAI) No. 10-41523, while there is disclosure of a method for manufacturing an insulated-gate semiconductor device using a self-alignment method, there is no disclosure of a method for manufacturing of a thin-film transistor using an alignment mark.

Additionally, in the Japanese Unexamined Patent-Publication (KOKAI) No. 11-87729, while there is a description of a method for manufacturing a semiconductor device using a semiconductor layer in a channel region that is laser annealed, there is no disclosure of a method for manufacturing of a thin-film transistor using an alignment mark.

In Japanese Patent No. 2734359, while there is a language describing a method for manufacturing a thin-film transistor having a step of forming a protective film is formed after formation of an activated layer and forming an alignment mark on the protective film, a step of using the alignment mark formed on the protective film to crystallize the activated layer, and then a step of removing the alignment mark along with the protective film, because separate steps are used to form the alignment mark and form the protective film, in addition to an increase in the number of process steps, when forming other constituent elements of the semiconductor device it is necessary to form yet another alignment mark, thereby rendering the process uneconomical.

Accordingly, in order to solve the problems presented by the above-noted drawbacks in the related art, it is an object of the present invention to provide thin-film transistor and manufacturing apparatus and method for same, wherein in a manufacturing step for a thin-film transistor or for an electronic apparatus using a thin-film transistor requiring alignment when performing laser exposure for localized crystallization of a semiconductor layer, the number of process steps thereof is not increased and the throughput thereof is high. It is a further object of the present invention to provide an electronic apparatus using a thin-film transistor such as an image sensor or a liquid-crystal display apparatus.

SUMMARY OF THE INVENTION

In order to achieve the above-noted objects, the present invention adopts the following basic technical constitution.

Specifically, a first aspect of the present invention is a thin-film transistor formed on a transparent substrate and comprising a gate electrode film layer and a source and drain region film layer, the thin-film transistor further comprising an alignment mark made of one and the same constituent material as a constituent material of at least one of the gate electrode film layer and the source and drain region, and formed at the same position as at least one of the gate electrode film layer or the source and drain region is formed.

A second aspect of the present invention is an apparatus for manufacturing a thin-film transistor, comprising, a light source means, a mask means for forming a light beam emitted from the light source means into a prescribed shape and forming a light path directing the shaped beam in a prescribed direction, and a substrate movement means onto which a substrate including a semiconductor device constituent part rests, movable so as to cause a prescribed location of the semiconductor device constituent part to oppose the light path, wherein the mask means comprises a alignment mark detection means for detecting an alignment mark provided on the semiconductor device constituent part.

A third aspect of the present invention is method for manufacturing a thin-film using an apparatus having a light source, a mask means for forming a light beam emitted from the light source into a prescribed shape and forming a light path directing the shaped beam in a prescribed direction and a substrate movement means onto which a substrate including a semiconductor device constituent part rests, movable so as to cause a prescribed location of the semiconductor device constituent part to oppose the light path, whereby an operation of aligning a desired light path in the mask means with a desired location on the semiconductor device constituent part is performed by referencing an alignment mark provided on the semiconductor device constituent part.

By adopting the above-noted technical constitutions, a thin-film transistor, an apparatus for manufacturing a thin-film-transistor, and a method for manufacturing a thin-film transistor according to the present invention, using a simple configuration, and without increasing the number of process steps, provide in a manufacturing process for a thin-film transistor or for an electronic apparatus using a thin-film transistor requiring alignment when performing laser exposure for localized crystallization of a semiconductor layer, a thin-film transistor and manufacturing method therefor, which feature both high throughput and low cost.

BRIEF DESCRIPTIONS OF THE DRAWINGS

FIGS. 1(A)–1(D) are cross-sectional views showing an example of a specification configuration of a thin-film transistor according to the present invention.

FIG. 2 is a drawing showing a specific example of a laser exposure means used in the present invention.

FIGS. 3(A)–3(D) are drawings illustrating a specific example of the process of a method for manufacturing a thin-film transistor according to the present invention.

FIGS. 4(E)–4(H) are drawings illustrating a specific example of the process of a method for manufacturing a thin-film transistor according to the present invention.

FIGS. 5(I)–5(J) are drawings illustrating a specific example of the process of a method for manufacturing a thin-film transistor according to the present invention.

FIGS. 6(a)–6(c) are drawings illustrating a specific example of the process of a method for manufacturing a thin-film transistor according to the present invention.

Figure 9:
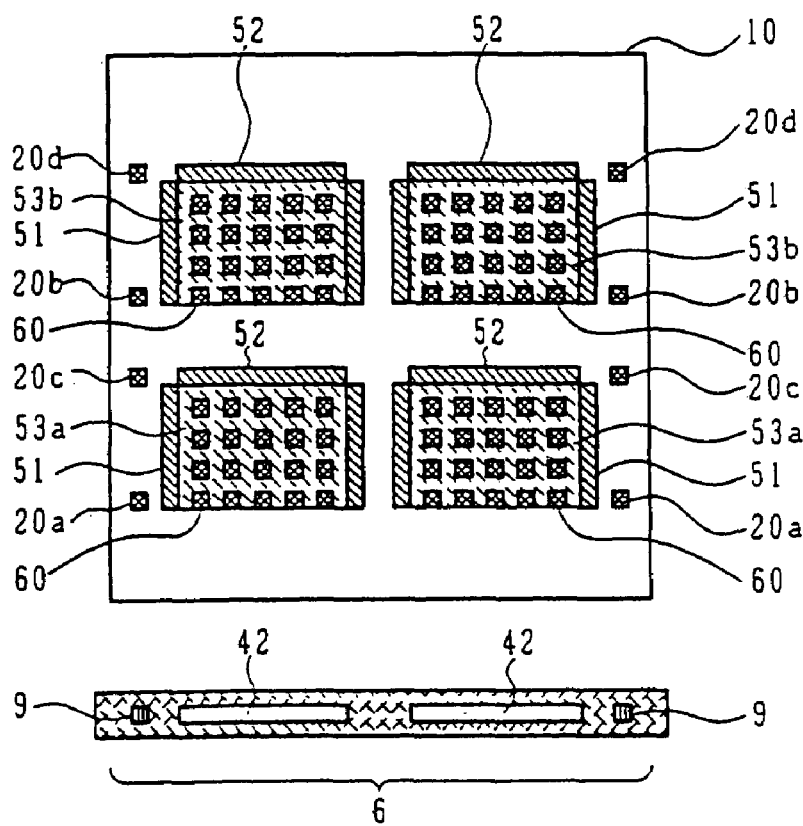

FIG. 9 is a plan view showing a laser exposure procedure for a pixel-switching element formation region of a liquid-crystal display apparatus in an example of a method for manufacturing a thin-film transistor according to the present invention FIGS. 10(A)–10(E) are drawings illustrating the process steps in another specific example of a method for manufacturing a thin-film transistor according to the present invention.

FIGS. 11(F)–11(I) are drawings illustrating the process steps in another specific example of a method for manufacturing a thin-film transistor according to the present invention.

FIGS. 12(J)–12(M) are drawings illustrating the process steps in another specific example of a method for manufacturing a thin-film transistor according to the present invention.

Figure 13:
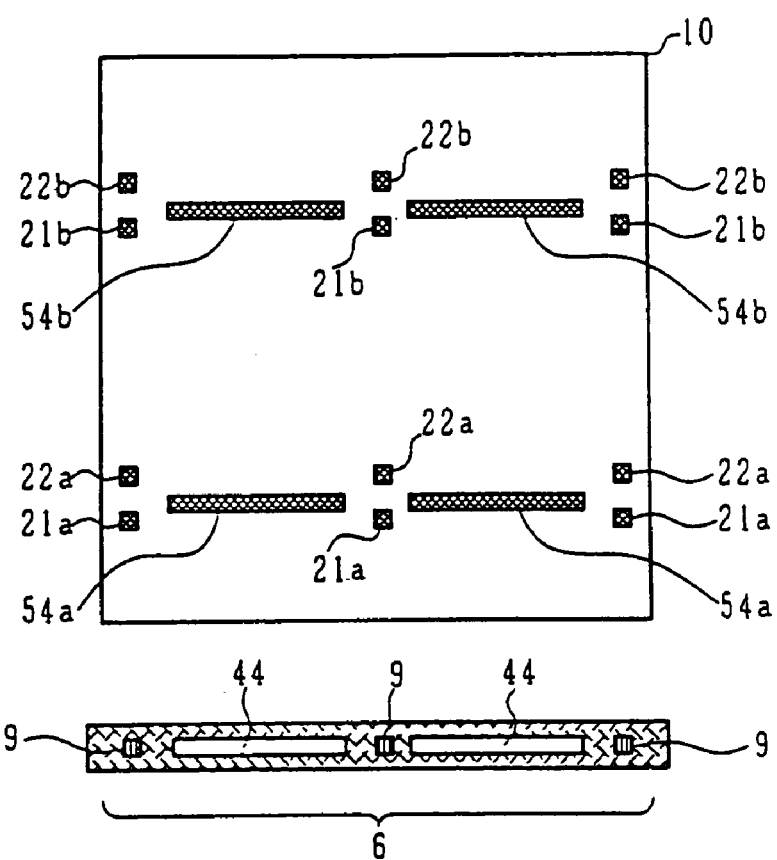

FIG. 13 is a plan view showing a laser exposure means for a drive circuit region of a pixel reading apparatus in another specific example of the present invention.

Figure 14:
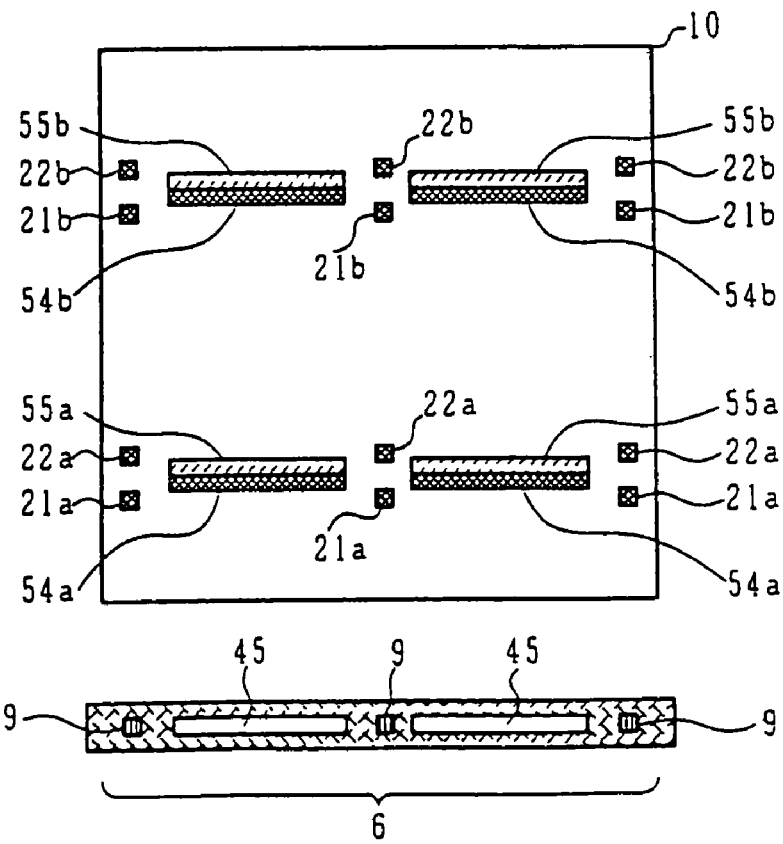

FIG. 14 is a plan view showing a laser exposure means for a pixel switching element region of a reading pixel apparatus in another specific example of the present invention.

FIGS. 15(A)–15(E) are drawings illustrating the process steps in yet another example of a method for manufacturing a thin-film transistor according to the present invention.

FIGS. 16(A)–16(E) are drawings illustrating the process steps in still another example of a method for manufacturing a thin-film transistor according to the present invention.

FIGS. 17(A)–17(D) are drawings illustrating the process steps in yet another example of a method for manufacturing a thin-film transistor according to the present invention.

FIGS. 18(E)–18(G) are drawings illustrating the process steps in yet another example of a method for manufacturing a thin-film transistor according to the present invention.

FIGS. 19(A)–19(D) are drawings illustrating the process steps in yet a different example of a method for manufacturing a thin-film transistor according to the present invention.

FIGS. 20(E)–20(H) are drawings illustrating the process steps in yet a different example of a method for manufacturing a thin-film transistor according to the present invention.

FIGS. 21(A)–21(B) are plan views showing an example of a method of exposure scanning of a laser and an example of a block exposure method in the present invention.

Figure 22:
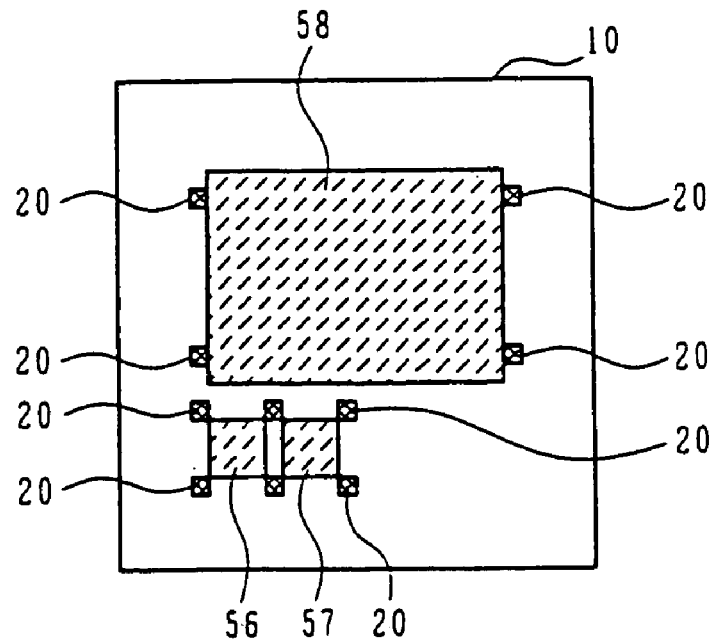

FIG. 22 is a plan view showing another example of exposure scanning of a laser in the present invention.

DETAILED DESCRIPTION OF THE PREFERRED EMBODIMENTS

Preferred embodiments of a thin-film transistor and an apparatus for manufacturing a thin-film transistor are described in detail below, with references made to relevant accompanying drawings.

Figure 1:
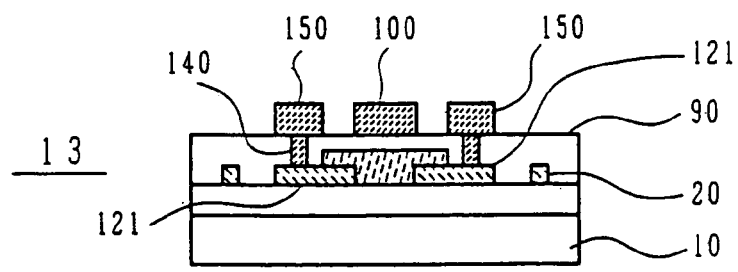
Figure 1:
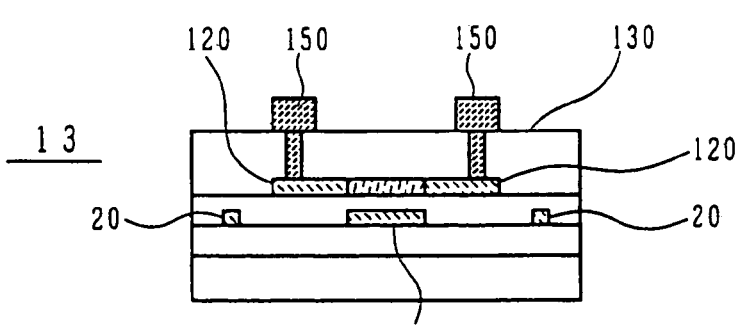
Figure 1:
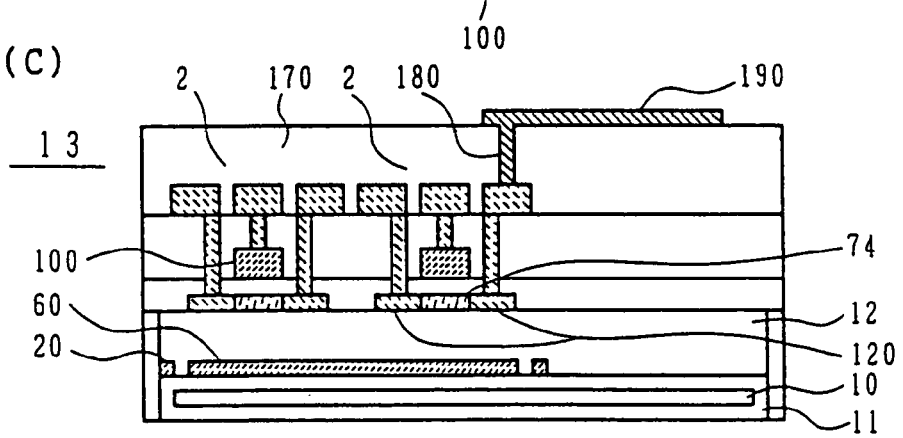
Figure 1:
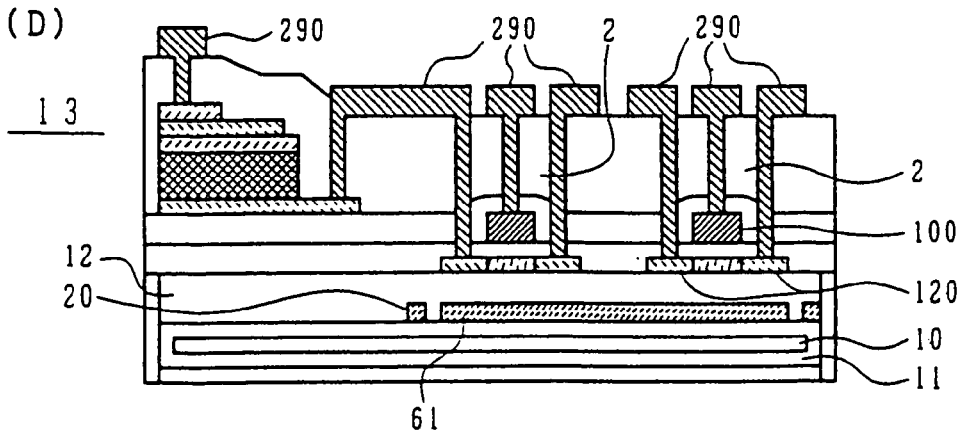

Specifically, FIG. 1(A) and FIG. 1(B) are drawings showing the configuration of an example of a thin-film transistor 13 according to the present invention.

These drawings show a thin-film transistor 13 is shown in which, the transistor 13 is formed on a transparent substrate 10, and comprising a gate electrode film 100 and source and drain regions layers 120 and 121, and further wherein an alignment mark 20 is provided, which is made of one and the same constituent material as a constituent material of at least one of the gate electrode film layer 100 and the source and drain region 120, and formed at the same position as at least one of said gate electrode film layer or said source and drain region 120.

Additionally, another specific example of the present invention, as shown in FIG. 1(C), is a thin-film transistor formed on a transparent substrate 10 and having a gate electrode film layer 100 and a source and drain regions 120, wherein a light-blocking layer 60 that blocks light that passes through the transparent substrate 10 and is incident via the substrate from striking the transistor activated layer (channel region) 74 is formed between the transistor part 2 and the transparent substrate 10, and wherein an alignment mark 20 is provided in the same location at which the light-blocking layer 60 is located, and is made of the same constituent material as the constituent material of the light-blocking layer.

Yet another specific example of the present invention, as shown in FIG. 1(D), is a thin-film transistor 13 with a transistor part 2 formed on a transparent substrate 10, and having a gate electrode film layer 100 and source and drain regions 120, wherein a shield layer 61 preventing electromagnetic waves passing through the transparent substrate 10 from striking from the substrate side and reaching an interconnect part 290 of the transistor part 2 is provided between the transistor part 2 and the transparent substrate 10, and further wherein an alignment mark 20 is provided at the same location as the location of the shield layer 61 and made of the same constituent material as the constituent material of the shield layer 61.

Another aspect of the present invention is an electrical apparatus using a thin-film transistor such as described above, and more particular, this is liquid-crystal display or image sensor or the like using the above-described thin-film transistor.

Figure 2:
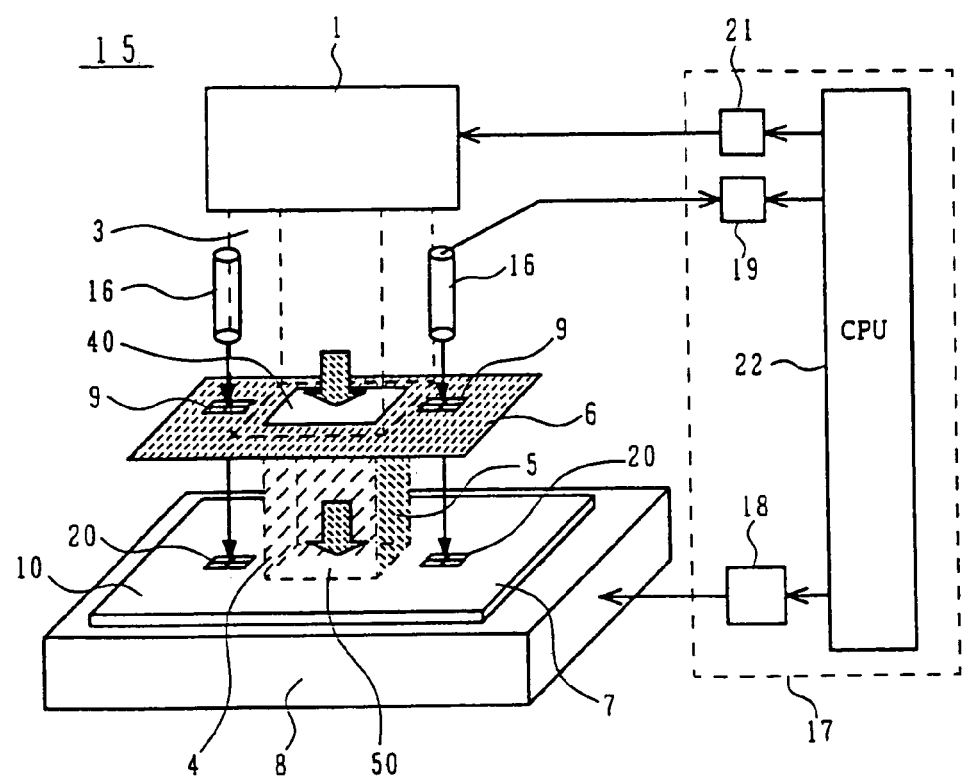

Yet another aspect of the present invention, as shown in FIG. 2, is an apparatus 15 for manufacturing a thin-film transistor, this apparatus having a light source 1, a mask means 6 for forming light beam 30 from the light source 1 into a desired shape and forming a light path 5 for directing the formed light beam 4 into a desired direction, and a substrate movement means 8, onto which is placed the substrate 10, including a semiconductor device constituent part 7, and which is movable so as to cause a desired location on the semiconductor device constituent part 7 to oppose the light path 5, wherein the mask means 6 is provided with an alignment mark detection means 9 for the purpose of detecting the alignment mark 20 provided on the semiconductor device constituent part 7.

In a thin-film transistor manufacturing apparatus 15 according to the present invention, the mask means 6 has one or more mask patterns 40 for the purpose of forming one or more formed light beams 4 having a cross-sectional area smaller than the cross-sectional area of a light beam 30 emitted from the light source 1.

Additionally, in the thin-film transistor manufacturing apparatus 15 according to this example, it is preferable that an image processing means 16 be provided opposite to the alignment mark detection means 9 in the mask means 6.

In FIG. 2, the reference numeral 50 indicates the area over which the formed light beam 4 is formed.

In the thin-film transistor manufacturing apparatus 15 according to the present invention, the operation of aligning the position of the desired light path 5 formed by the mask means 6 and the desired location on the semiconductor device constituent part 7 is performed by executing referencing of an alignment mark 20 provided on the semiconductor device constituent part 7.

More specifically, in the present invention the operation of aligning the position of the desired light path 5 formed by the mask means 6 and the desired location on the semiconductor device constituent part 7 is performed by performing control so that the alignment mark detection means 9 provided in the mask means 6 is aligned with the alignment mark 20 provided in the semiconductor device constituent part 7.

For this reason, it is desirable in the present invention to have a configuration in which a control means 17 connected to the substrate movement means 8 performs control so that the alignment mark detection means 9 provided in the mask means 6 is aligned with the alignment mark 20 provided in the semiconductor device constituent part.

More specifically, it is desirable that the control means 17 have a first control means 18 for direct drive control of the substrate movement means 8, a second control means 20 for analyzing information input from the image processing means 16 connected to the alignment mark detection means 9 and outputting prescribed control information, a third control means 21 for drive control of the light source 1, and a central processing unit (CPU) 22 for drive control of the above-noted control means.

It is desirable that the alignment mark 20 formed at an arbitrary location on the semiconductor device constituent part 7 be formed in the process step whereby the semiconductor device is formed, as one constituent part thereof.

As described above, the present invention relates to a thin-film transistor, an electronic apparatus such as a liquid-crystal display, image sensor, printer head, or memory or the like using a thin-film transistor, and a method of manufacturing same. In particular, in relates, in a thin-film transistor a crystalline semiconductor layer formed by excimer laser annealing, to the forming a laser alignment mark used when positioning for laser exposure, and a method of positioning using same.

That is, as is clear from the foregoing description, according to one specific example of the present invention a thin-film transistor 13 made from a semiconductor film, formed on a transparent substrate and having a light-blocking layer 60 for blocking light incident from the substrate side passing through the substrate, this transistor having an alignment mark 20 formed simultaneously with the above-noted light-blocking layer 60, wherein all or part of a channel region, and a source drain region 120 of the thin-film transistor 13 is formed by laser light exposure, referencing the alignment mark 20.

In a thin-film transistor 13 made formed on an insulation substrate and made of a semiconductor film, having a shield layer 61 for blocking electromagnetic waves incident from the substrate side passing through the substrate, the thin-film transistor has an alignment mark 20 formed simultaneously with the shield layer 61, wherein all or part of a channel region, and a source drain region of the thin-film transistor 13 is formed by laser light exposure, referencing the alignment mark 20.

Additionally, it is possible to fabricate a liquid-crystal display apparatus 13' using a thin-film transistor 13 made of a semiconductor film, which is formed on a transparent substrate and has a light-blocking layer 61 for the purpose of blocking light that is incident from the substrate side through the substrate, wherein this transistor has an alignment mark formed simultaneously with the above-noted light-blocking layer, wherein either all or part of the channel region or source drain region of the thin-film transistor is formed by using laser light exposure, referencing the alignment mark.

Alternately, an image sensor using a thin-film transistor made of a semiconductor film, which is fabricated using a thin-film transistor formed on an insulation substrate and having a shield layer for blocking electromagnetic waves and a light-blocking layer for blocking light that is incident form the substrate side through the substrate, wherein this transistor has an alignment mark formed simultaneously with the above-noted shield layer and above-noted light-blocking layer, and wherein either all or part of the channel region or source drain region of the thin-film transistor is formed using laser light exposure, referencing the alignment mark.

In the same manner, a thin-film transistor made of a semiconductor film, which is formed on an insulation substrate, and which has source and drain electrodes on the substrate, wherein an alignment mark is formed simultaneously with the source and drain electrodes, and wherein all or a part of the channel region and source drain region of the thin-film transistor is formed using laser light exposure, referencing the alignment mark.

It is possible to achieve specific examples of a thin-film transistor formed on an insulation substrate and having a gate electrode on the substrate, this transistor having an alignment mark formed simultaneously with the source and drain electrodes, wherein all or part of the channel region and source drain region of the thin-film transistor is formed by laser light exposure, referencing the alignment mark.

In the present invention, as is clear from the foregoing description, the following advantages are achieved.

Specifically, in a process of fabricating a thin-film transistor, by fabricating an alignment mark simultaneously with the fabrication of a light-blocking layer, shield layer, source drain region, and gate electrode film layer, it is possible to reduce the number of process steps.

In a method for forming an alignment mark simultaneously with the light-blocking layer and the shield layer, by using an insulation film to provide interlayer separation for the alignment mark, the semiconductor film surface is not contaminated in the process step for patterning or the like.

By forming a gate oxide film over the entire surface immediately after laser crystallization, it is possible to form an MOS boundary.

Thus, it is possible to manufacture an electronic apparatus such as liquid-crystal display, or image sensor or the like, which uses a thin-film transistor, without increasing the number of process steps, and without semiconductor film surface contamination.

Specific examples of the present invention are described in detail below, with references made to relevant accompanying drawings.

First, a first specific example of a method for manufacturing a thin-film transistor according to the present invention is described below, with reference made t FIG. 2, FIG. 3, FIG. 4, and FIG. 5.

The first embodiment of the present invention is a method of performing patterning for an alignment mark 20 for use in laser exposure, on the same layer as the light-blocking layer 60.

Figure 3:
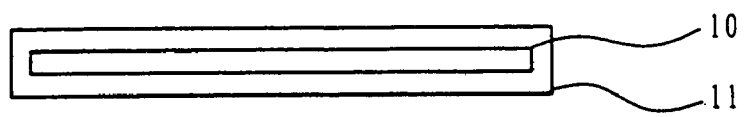
Figure 3:
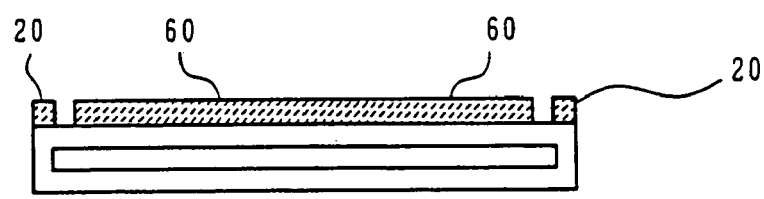
Figure 3:
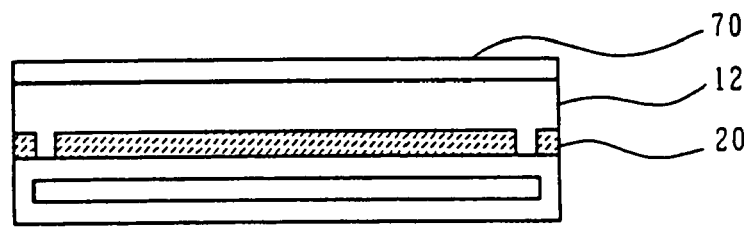
Figure 3:
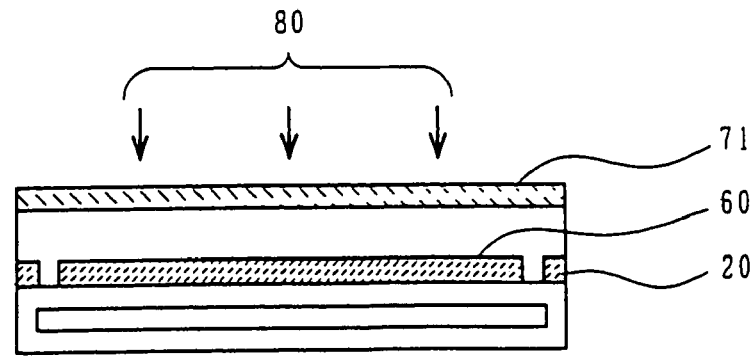
Figure 4:
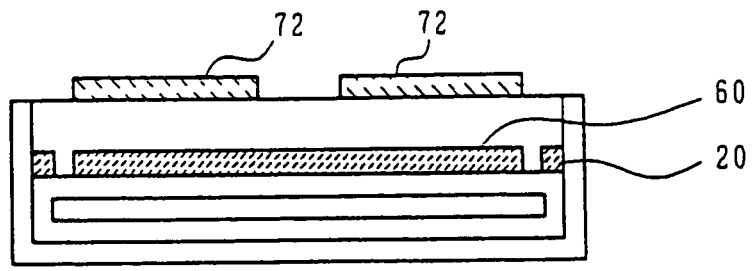
Figure 4:
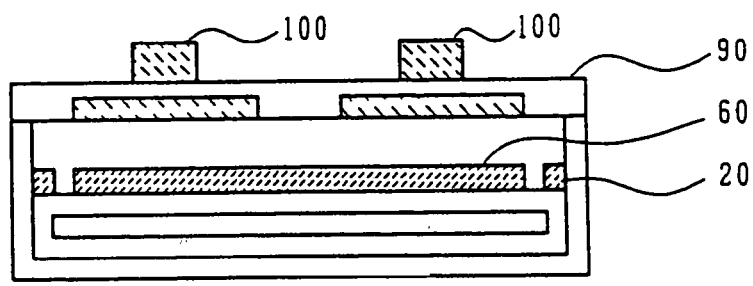
Figure 4:
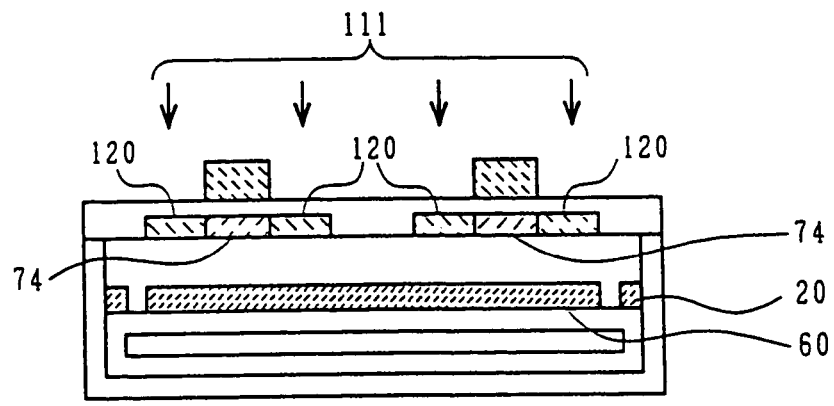
Figure 4:
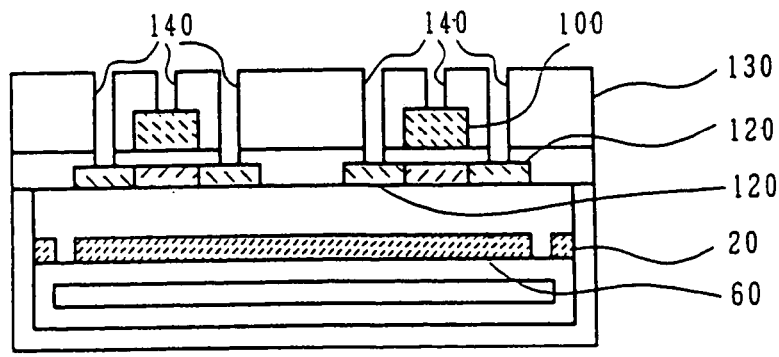
Figure 5:
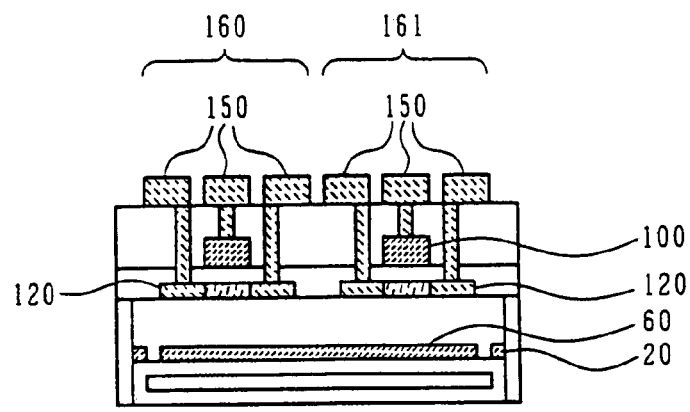
Figure 5:
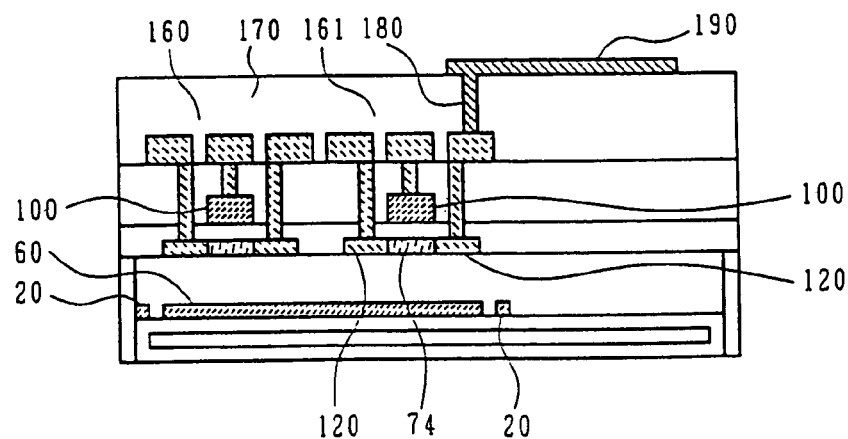
Figure 6:
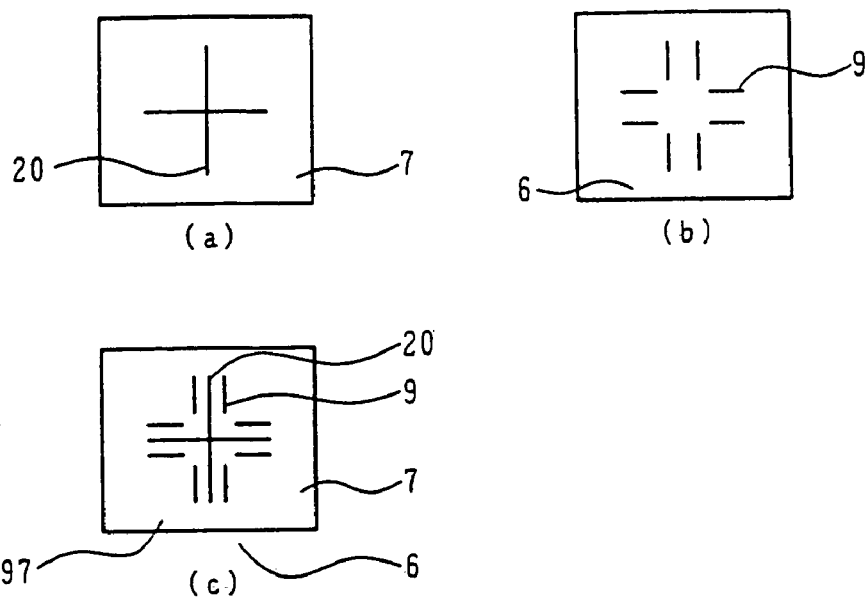

FIG. 3 to FIG. 5 show cross-sectional views of the manufacturing process steps for a liquid-crystal display 13', FIG. 2 is a schematic representation of a method of positioning for laser exposure, and FIG. 6 is a plan view showing the pattern of the alignment mark for laser exposure and the pattern mark on the laser exposure side.

The various manufacturing process steps for a thin-film transistor 13 according to this example of the present invention are described below in detail, with reference made to FIG. 3 to FIG. 5.

First, referring to FIG. 3(a), a silicon oxide film for protecting the surface of the substrate of the substrate 10 from contamination diffusion is formed using a reduced-pressure CVD process, using silane gas ($SiH_4$) at 50 sccm, and oxygen gas ($O_2$) at 500 sccm flow rate maintained constant within the chamber, so as to deposit a cover oxide film 11 having a thickness of 300 nm.

The film-growing conditions are a film-growing temperature of 400° C. and a pressure of 200 mTorr. The substrate 10 can be made of soda lime glass, or of fused silica, and the cover insulation film can be a transparent insulating material, such as silicon nitride, silicon oxynitride, or the like.

The cover insulation film 11 can be formed by a reduced-pressure high-temperature CVD process as well as by a plasma CVD process using silane or oxygen or the like, by a plasma CVD process using TEOS as the raw material, or by a normal-pressure CVD process (hereinafter referred to as TEOS CVD). Additionally, the film thickness can be deposited to a value ranging from 100 nm to approximately 1000 nm.

Next, turning to FIG. 3(b), a sputtering process is used to deposit tungsten silicide to a thickness of 175 nm, after which a light-blocking layer 60 for the purpose of blocking light from the thin-film transistor element, and an alignment mark 20 for laser exposure are each patterned as desired, using one patterning operation.

The material used to form the light-blocking layer 60 is desirably a high-melting-point meal such as molybdenum, tungsten, titanium, or a silicide film there of and the material and-film thickness can be selected so as to achieve sufficient blocking of light from the transistor.

With regard to the laser exposure alignment mark as well, the material can be any one that enables the achievement of an alignment pattern.

After the above, as shown in FIG. 3(c), a plasma CYD process using TEOS as the raw material is used to form a interlayer insulation film of silicon oxide, to a thickness of 1000 nm. The growth of the silicon oxide film using the TEOS CVD process is done with TEOS at 300 sccm, He at 100 sccm, $O_2$ at 6000 sccm, a film growing temperature of 410° C., and a film-growing pressure of 170 Pa, with RF power of 1500 watts.

The interlayer insulation film 12 can be deposited to a film thickness in the range from 700 nm to 1000 nm, and can be formed by a plasma CVD process using silane, oxygen, or NO gas or the like, by a reduced-pressure CVD process, or by normal-pressure CVD. The material need not be a silicon oxide film, and can alternately be a silicon nitride film or a silicon oxynitride film or the like.

After the above, a reduced-pressure CVD process is used at a film-growing temperate of 450° C., with silane ($Si_2H_6$) at 200 sccm, and a film-growing pressure of 150 mTorr to deposit a silicon film 70 used as the transistor activated layer to a thickness of 75 nm.

By using a reduced-pressure CVD process, the silicon film 70, as shown in FIG. 3(c) is deposited over the entire surface.

Alternatively, by using a gas mixture of diborane and disilane, it is possible to form a silicon film for the purpose of controlling the threshold value of the transistor, and it is possible to achieve p-channel and n-channel transistor characteristics that are symmetrical about the gate voltage 0 V region.

This configuration is effective with CMOS circuits. The gas diborane/disilane concentration ratio is controlled from 0.1 to 100 ppm, by varying either one or both of diborane and disilane gas flow rates. The silicon film can also be formed as either a crystalline film or an amorphous film, using either a plasma CVD process or sputtering process, and can also be a film into which an impurity such as diborane ($B_2H_5$) is not introduced. After this, as shown in FIG. 3(d), positioning is done, using the laser exposure alignment mark 20 as a reference. The positioning method will be described later.

After performing alignment, an XeCl (308 nm) excimer laser is used to perform annealing, with laser exposure 80 performed with an exposure energy of 350 mJ/cm$^2$ (10 shots/point), so as to form a crystalline silicon film 71 (FIG. 3(d)).

The exposure energy is different, depending upon the thickness of the silicon film, and can be selected as appropriate for the silicon film thickness, in order to achieve the required crystallization.

The laser used can alternately be a KrF (248 nm) excimer laser.

Next, the crystalline silicon film 71 is patterned, and dry etching is done to achieve an island-patterned silicon film 72 such as shown in FIG. 4(e)

After the above, plasma CVD using TEOS as a raw material is used, with TEOS at 300 sccm, He at 100 sccm, $O_2$ at 6000 sccm, a film-growing temperature of 410° C., a film-growing pressure of 170 Pa, and an RF power of 1500 watts, so as to deposit a silicon oxide film to a thickness of 100 nm, thereby forming the gate insulation film 90.

The gate insulation film 90 can also be formed using a normal-pressure CVD process, a reduced-pressure CVD process using silane, oxygen or the like, or a plasma CVD process.

After the above, as shown in FIG. 4(f), sputtering is used to deposit a tungsten silicide film having a thickness of 100 nm, this serving as the gate electrode 100 after patterning.

The gate electrode 100 desirably is made from a high-melting-point metal or a silicide film thereof, but need not be a high-melting-point metal, as long as it is a low-resistance interconnect material.

After the above, as shown in FIG. 4(g), the gate electrode 100 is used as a mask in performing ion doping with an impurity ion 111 such as arsenic. After this is done, heat-treating is performed to activate the impurity, thereby forming the source and drain regions 120. When this is done, bottom part of the gate electrode 100 serves as the channel region 74.

After the above, as shown in FIG. 4(h), plasma CVD using TEOS as a raw material is performed with TEOS at 300 sccm, He at 100 sccm, $O_2$ at 6000 sccm, a film-growing temperature of 410° C., a film-growing pressure of 170 Pa, and an RF power of 1500 watts, so as to deposit a silicon oxide film having a thickness of 300 nm, thereby forming an interlayer insulation film 130.

After the above, dry etching is done over the source and drain regions 120 and the gate electrode 100, so as to form contact holes 140.

Next, as shown in FIG. 5(i), aluminum is deposited by sputtering and then patterned, so as to form the interconnect electrodes 150.

This above operations complete the thin-film transistor 13, which is formed by a transistor part 160 for peripheral circuitry and the transistor 161 for display electrodes.

Next, after applying a spin coat solvent on to the substrate for the purpose of achieving flattening and interlayer separation, the substrate is rotated, so as to achieve a uniform film thickness on the substrate having a thickness of 1 μm.

After this is done, burn-in is done in an atmosphere of nitrogen, at a temperature of 300° C. for 1 hour.

After completion of burn-in, cooling is done, thereby forming the interlayer separation film 170. The interlayer separation film 170 can also be formed using a plasma CYD process with silane or oxygen or the like, or a plasma CYD process using TEOS as the raw material, or a normal-pressure CYD process, and can-also be a silicon-oxide film, or a silicon nitride film or the like.

Next, the dry etching method is used to form a display electrode contact hole 180 with respect to the interconnect electrode 150 of the transistor part 161 for display electrode switching.

Next, an ITO film is deposited using sputtering and then patterned, after which a display electrode 190 is formed. After this, a silicon film deposited on the rear surface of the substrate by a reduced-pressure CYD process is removed by means of dry etching and, as shown in FIG. 5(j), this completes the liquid-crystal display 13'.

The method of performing alignment when performing laser exposure is described below, with reference to FIG. 2. FIG. 2 is a schematic representation of part of a laser exposure apparatus, the major elements of which are a substrate movement means 8 formed by a stage onto which the substrate 10 is placed, a mask part 6 disposed thereover, and a CCD camera, which serves as an example of an image processing means 16 for detecting the alignment mark.

The mask part 6 has laser exposure side alignment mark 9 and a matrix slit part 40. The CCD camera 16 is installed over the laser exposure part alignment mark 9 for the purpose of detecting alignment mark coincidence.

First, the laser exposure part alignment mark 9 is formed within the mask part 6, this position being taken as the position opposite an alignment mark 20 for laser exposure formed on the semiconductor device constituent part 7 forming on the substrate 10.

The substrate 10 placed on the stage 8 of the substrate movement means is positioned so that there is coincidence between the laser exposure alignment mark 20 in the semiconductor device constituent part 7 and the laser exposure part alignment mark 9 by detecting the alignment marks by the image processing means 16.

The mask part 6 can also be made movable, if necessary. In particular, in the case in which the mask part 6 has a plurality of mask patterns formed therein, this is particularly effective in quickly selecting a mask pattern of the plurality of mask patterns and moving the selected pattern to the desired location of the semiconductor device constituent part 7.

When performing positioning, the position adjustment is done by moving the stage 8. When this is done, the substrate 10 is held onto the stage 8 by a vacuum chuck, so that it does not easily slide.

Next, the pattern shapes of the laser exposure part alignment mark 9 and the laser exposure alignment mark 20 are described below.

The shape of the laser exposure alignment mark 20 is a cross pattern such as shown in FIG. 6(a), or a pattern such as shown in FIG. 6(b) which surrounds a cross. The image processing means 16, for example, a CCD camera detects the laser exposure part alignment mark 9 and the laser exposure alignment mark 20 and performs positioning such that the patterns are superposed, as shown in FIG. 6(c).

That is, the reference numeral 97 in FIG. 6(c) indicates the condition in which the alignment operation has been completed.

After a positioning operation as described above, laser exposure is performed. In this case, a cross pattern is used, although it will be understood that, as long as the pattern enables precise positioning, the pattern is not restricted to the cross pattern.

Next, the details of the laser exposure procedure in the first embodiment, for the case of using liquid-crystal display 13' is described below in detail, with reference being made to FIG. 7, FIG. 8, and FIG. 9.

Figure 7:
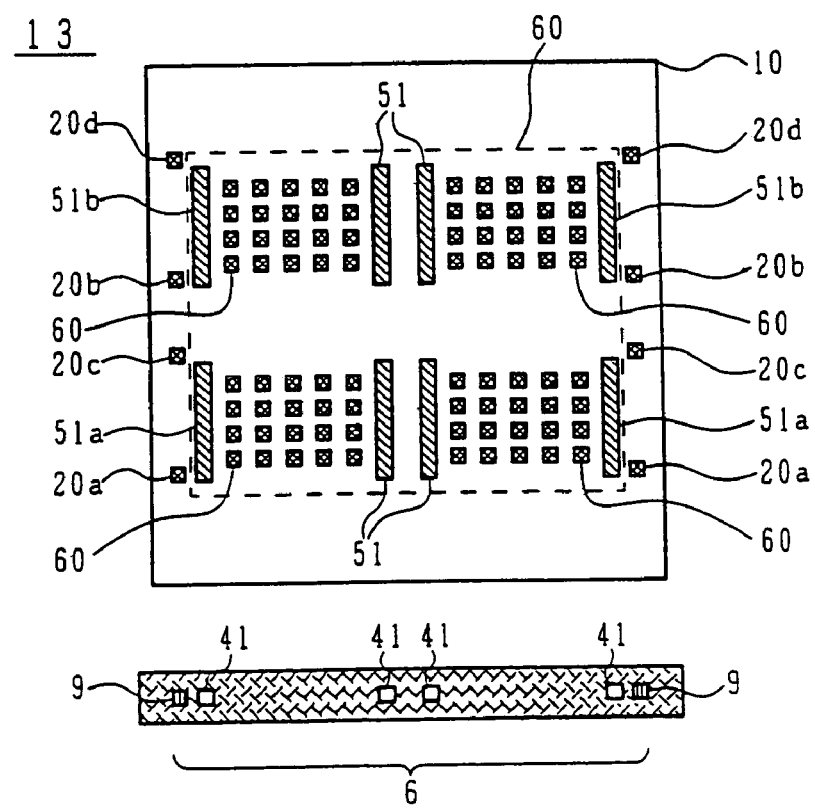
FIG. 7 is a plan view showing a laser exposure procedure for a gate drive circuit region of a liquid-crystal display apparatus in an example of a method for manufacturing a thin-film transistor according to the present invention.
Figure 8:
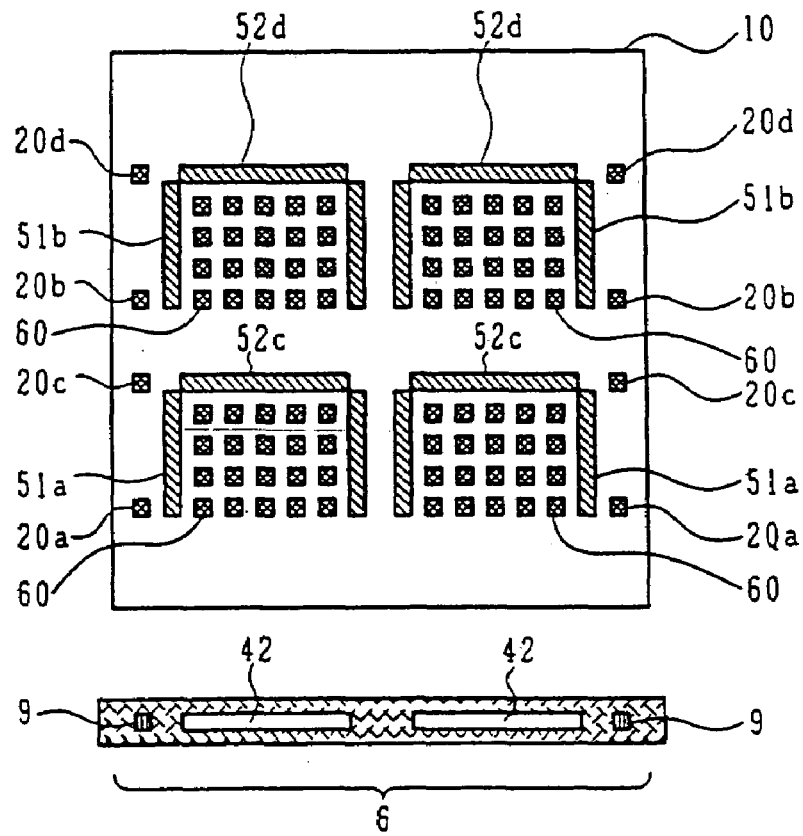
FIG. 8 is a plan view showing a laser exposure procedure for a data signal drive circuit region of a liquid-crystal display apparatus in an example of a method for manufacturing a thin-film transistor according to the present invention.

FIG. 7 is a plan view showing the method of laser exposure on a gate signal drive circuit formation exposure region, FIG. 8 is a plan view showing a method of laser exposure on a data signal drive circuit formation region, and FIG. 9 is a plainview showing a method for laser exposure on a pixel switching element formation exposure region.

First, the procedure for exposure of the gate signal drive circuit region is described below, with reference to FIG. 7.

First, mask slits 41 corresponding to the gate signal drive circuit formation exposure regions 51 are provided on the mask part 6, and alignment is done of the laser exposure alignment mark 20a and the laser exposure part alignment mark 9, after which laser exposure is done of the gate signal drive circuit formation region 51a, as scanning is performed from the front side of the substrate 10, with a prescribed scanning step.

Next, after aligning the laser exposure alignment mark 20b and the laser exposure part alignment mark 9, laser exposure is done of the gate signal drive circuit formation region 51b, as scanning is performed from the front side of the substrate 10, with a prescribed scanning step.

Next, the case of laser exposure of a data signal drive circuit formation exposure region is described below, with reference to FIG. 8.

First, mask slits 42 corresponding to the data signal drive circuit formation exposure regions 52 are provided on the mask part 6, and alignment is done of the laser exposure alignment mark 20c and the laser exposure part alignment mark 9, after which laser exposure is done of the data signal drive circuit formation region 52c, as scanning is performed from the front side of the substrate 10, with a prescribed scanning step.

Next, after aligning the laser exposure alignment mark 20d and the laser exposure part alignment mark 9, laser exposure is done of the data signal drive circuit formation region 52d, as scanning is performed from the front side of the substrate 10, with a prescribed scanning step.

Next, the case of laser exposure of a pixel switching element drive circuit formation exposure region is described below, with reference to FIG. 9.

First, mask slits 43 corresponding to the pixel switching element formation exposure regions 53 are provided on the mask part 6, and alignment is done of the laser exposure alignment mark 20a and the laser exposure part alignment mark 9, after which laser exposure is done of the data signal drive circuit formation region 53a, as scanning is performed from the front side of the substrate 10, with a prescribed scanning step.

Next, after aligning the laser exposure alignment mark 20a and the laser exposure part alignment mark 9, laser exposure is done of the data signal drive circuit formation region 53a, as scanning is performed from the front side of the substrate 10, with a prescribed scanning step.

Next, after aligning the laser exposure alignment mark 20b and the laser exposure part alignment mark 9, the pixel-switching element formation region 53b is scanned from the front side of the substrate, with a prescribed scanning step.

In this manner, it is possible to obtain a silicon film crystallized with the required laser exposure energy in a region for formation of a drive circuit and a region for formation of a pixel-switching element, by performing alignment when performing laser exposure.

In this case, although alignment marks are provided on each end of the substrate, it will understood that the alignment marks can be in any position, as long as the laser exposure part alignment mark and the laser exposure alignment mark are in corresponding positions.

In a process for manufacturing a liquid-crystal display 13' having laser exposure that requires alignment, by forming the laser exposure alignment mark in a single patterning operation together with the light-blocking layer, it is possible to achieve a manufacturing process without an-increase in the number of process steps.

Figure 10:
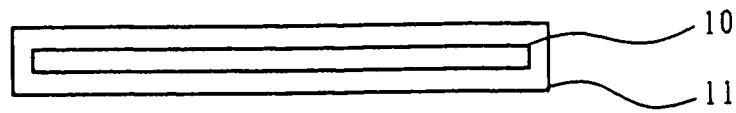
Figure 10:
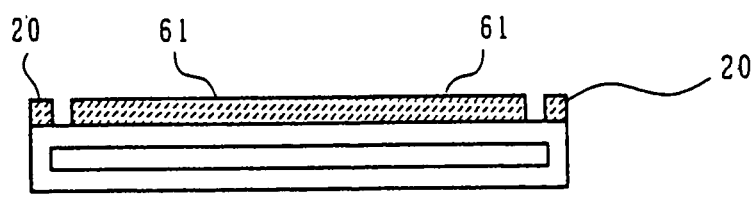
Figure 10:
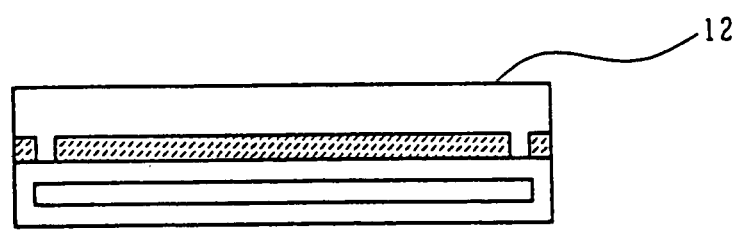
Figure 10:
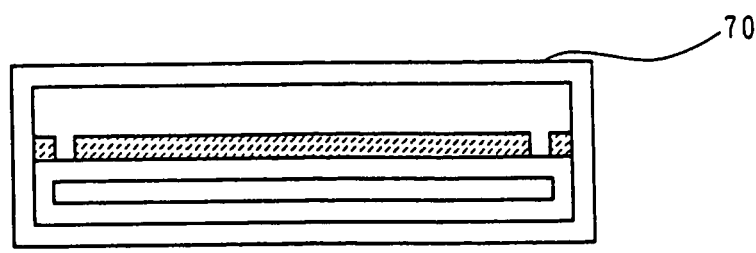
Figure 10:
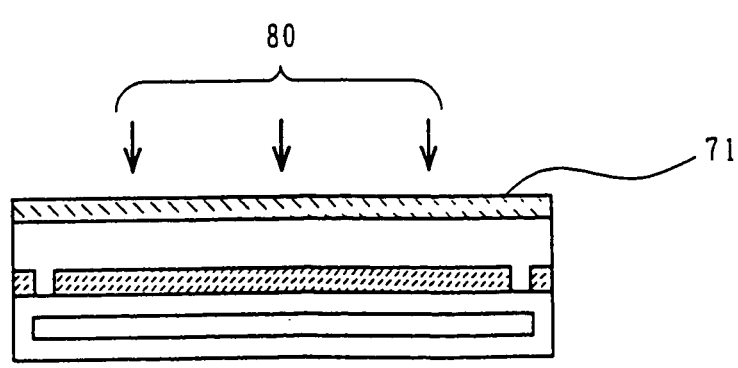
Figure 11:
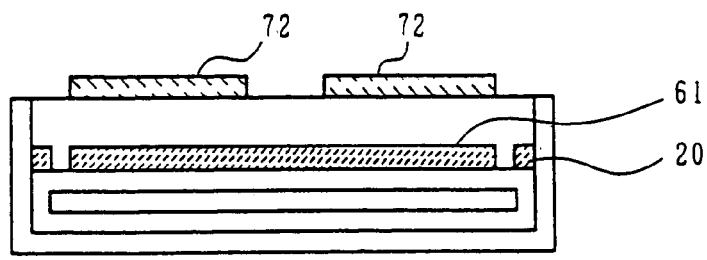
Figure 11:
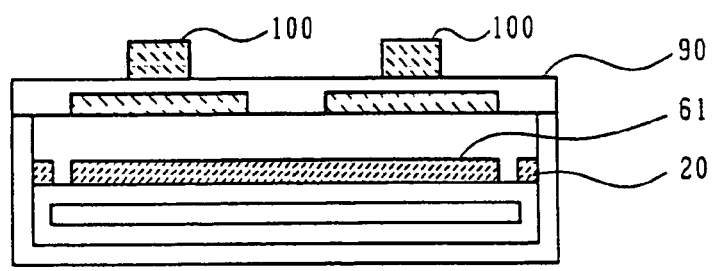
Figure 11:
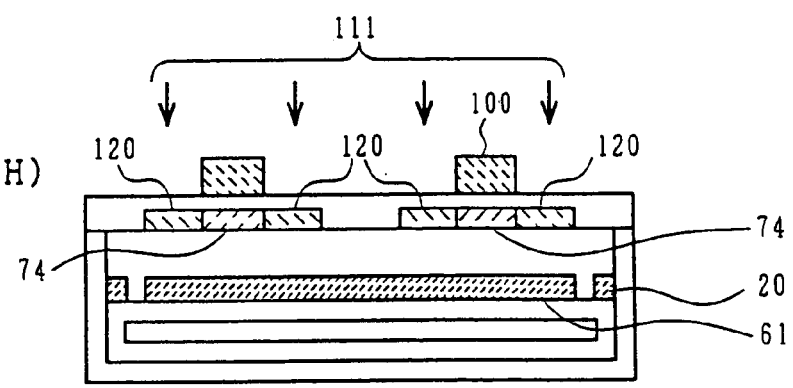
Figure 11:
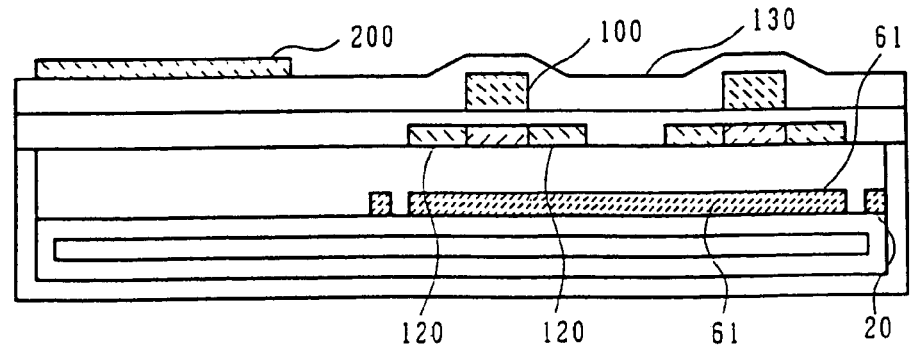
Figure 12:
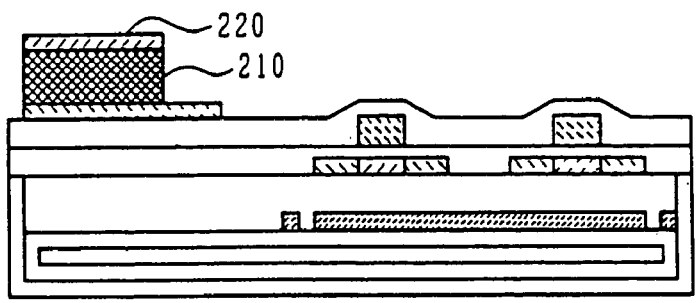
Figure 12:
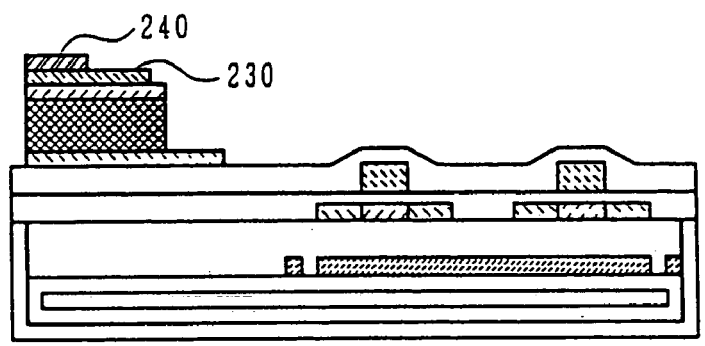
Figure 12:
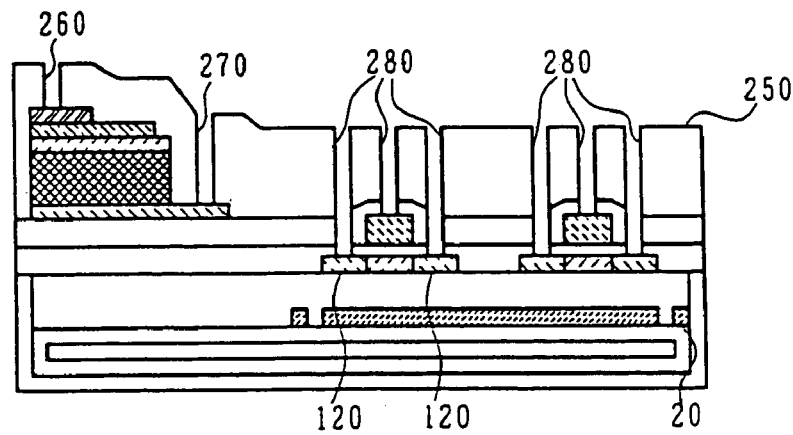
Figure 12:
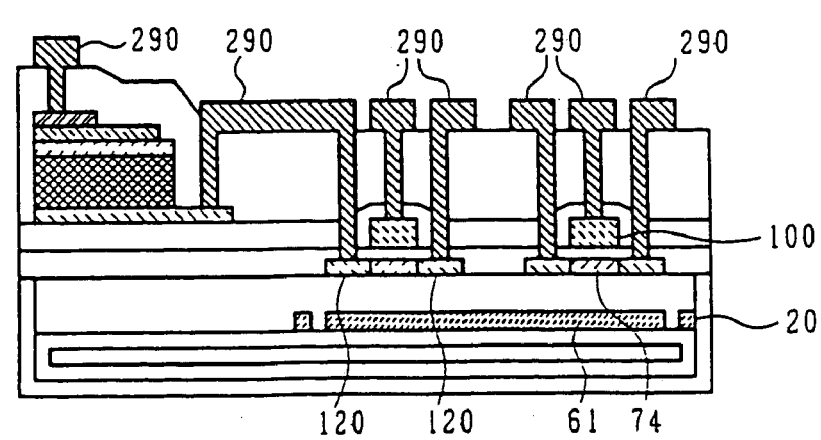

Next, an example of manufacturing an image reading apparatus 13" using a thin-film transistor such as shown in FIG. 1(D) is described as a second specific example of the present invention, with references made to FIG. 10 to FIG. 12.

FIG. 10 is a cross-sectional view showing the manufacturing process steps for the image reading apparatus 13". In this example, a laser exposure alignment mark is formed on the same layer as the shield layer of the image reading apparatus 13".

First, as shown in FIG. 10(a), a silicon oxide film for preventing contamination diffusion is deposited onto a non-alkaline glass substrate 10, using a CVD process, using silane glass ($SiH_4$) at 50 sccm, oxygen gas ($O_2$) at 500 sccm, maintained at constant flow rates in the chamber, at a film-growing temperature of 400° C., and a film-growing pressure of 200 mTorr, so as to achieve a cover insulation film 11 having a thickness of 300 nm.

This substrate can be made of soda lime glass, fused silica, or the like, and the cover insulation film can be a transparent insulating material, such as silicon nitride, silicon oxynitride, or the like. The cover insulation film need not be formed by a reduced-pressure CVD process, and can alternately be formed by a plasma CVD process using silane, oxygen or the like, a plasma CVD process using TEOS as the raw material, or a normal-pressure CVD process. The film is deposited to a thickness in the range 100 nm to 1000 nm.

Next, turning to FIG. 10(b), a sputtering process is used to deposit tungsten silicide to a thickness of 175 nm, after which a shield layer 61 and an alignment mark 20 for laser exposure are each patterned as desired, using one patterning operation.

The shield layer 61 is formed for the purpose of solving the problem of introduction of noise into the interconnects, which is generated when the image reading apparatus 13 is operated, this noise coming from, for example, the clock signal interconnect.

For this reason, the shield layer 61 is preferably disposed on a lower level which surrounds an interlayer insulation film over substantially the entire region for forming a drive circuit that is made up of registers and output circuits, for example.

The material for forming the shield layer 61 is desirably a high-melting-point meal such as molybdenum, tungsten, titanium, or a silicide film thereof, and need not be a material with a high melting point, as long as it is selected to achieve sufficient shielding effectiveness.

After forming the shield layer 61 described above and the laser alignment mark 20, as shown in FIG. 10(c) a plasma CVD process using TEOS as a raw material is used to form a silicon oxide interlayer insulation film 12 to a thickness of 1000 nm.

The silicon oxide film grown using the TEOS CVD process is grown with TEOS at 300 sccm, He at 100 sccm, $O_2$ at 6000 sccm, a film-growing temperature of 410° C., a film-growing pressure of 170 Pa, and an RF power of 1500 watts.

The interlayer insulation film 12 can be deposited to a thickness in the range from 700 nm to 1000 nm, and can alternately be formed using a normal-pressure CVD process with TEOS as the raw material, or using a plasma CVD process using silane or oxygen or the like as the raw material.

The material need not be a silicon oxide film, and can alternately by a silicon nitride film or a silicon oxynitride film or the like.

After the above, as shown in FIG. 10(d), a reduced-pressure CVD process is used to deposit a silicon film 70 to a thickness of 75 nm, to serve as the transistor active layer, this being formed at a film-growing temperature of 450° C., with silane ($Si_2H_8$) at 200 sccm, and a film-growing pressure of 150 mTorr.

By using a gas mixture of diborane and disilane, it is possible to form a silicon film for the purpose of controlling the threshold value of the transistor, and it-is possible to achieve p-channel and n-channel transistor characteristics that are symmetrical about the gate voltage 0 V region. This configuration is effective with CMOS circuits.

The gas diborane/disilane concentration ratio is controlled from 0.1 to 100 ppm, by varying either one or both of diborane and disilane gas flow rates. The silicon film can also be formed as either a crystalline film or an amorphous film,-using either a plasma CYD process or sputtering process, and can also be a film into which an impurity such as diborane (B2H6) is not introduced.

After this, as shown in FIG. 10(e), positioning is done, using the laser exposure alignment mark 20 as a reference. The positioning method will be described later.

After performing positioning, an XeCl (308 nm) excimer laser is used to perform annealing, with laser exposure 80 performed with an exposure energy of 380 mJ/cm$^2$ (10 shots/point), so as to form a crystalline silicon film 71.

The exposure energy is different, depending upon the thickness of the silicon film, and can be selected as appropriate for the silicon film thickness, in order to achieve the required crystallization. The laser used can alternately be a KrF (248 nm) excimer laser.

Next, patterning and dry etching are done to achieve an island-patterned silicon film 72 such as shown in FIG. 11(f).

After the above, as shown in FIG. 11(g), plasma CVD using TEOS as a raw material is used, so as to form a silicon oxide film to a thickness of 100 nm, thereby forming the gate insulation film layer 90. The gate insulation film 90 can also be formed using a normal-pressure CVD process with TEOS as a raw material, or a reduced-pressure CYD process using silane, oxygen, or the like.

After the above, sputtering is done to deposit a tungsten silicide film having a thickness of 100 nm, this serving as the gate electrode 100 after patterning.

The gate electrode 100 desirably is made from a high-melting-point metal or a silicide film thereof, but need not be a high-melting-point metal, as long as it is a low-resistance interconnect material.

After the above, as shown FIG. 11(h), the gate electrode 100 is used as a mask in performing ion doping with an impurity ion 111 such as arsenic. After this is done, heat-treating is performed to activate the impurity, thereby forming the source and drain regions 120.

When this is done, bottom part of the gate electrode 100 serves as the channel region 74.

After the above, as shown in FIG. 11(i), a plasma CVD process using TEOS as a raw material is used to form an interlayer insulation film 130 made of a silicon oxide film, to a thickness of 300 nm, after which a lower lead electrode for connecting a thin-film transistor to a reading pixel part is formed by chrome using sputtering, to a thickness of 100 nm, this forming the lower electrode 200 after patterning.

Next, as shown in FIG. 12(j), an amorphous silicon film is formed as a light-receiving element 210 on the interlayer insulation film 130 and the lower electrode 200, and over this a p-type semiconductor film 220 having a p-type impurity and a P-type amorphous silicon carbide film are continuously deposited, after which patterning is performed of the light-receiving element.

The film thickness of the amorphous silicon film 210 is 1 (m, and the film thickness of the p-type amorphous carbide film 220 is 20 nm.

Next, as shown in FIG. 12(k), ITO is deposited by sputtering and patterned, so as to form an upper transparent electrode 230.

A barrier metal 240 for the purpose of connecting the upper transparent electrode 230 and aluminum interconnect that serves as an upper lead electrode is formed by sputtering tungsten silicide and then patterned.

Next, as shown in FIG. 12(l), a silicon nitride film is deposited to a thickness of 400 nm using a plasma CVD process, thereby forming an interlayer insulation film 250.

Next, an upper transparent electrode contact hole 260, a lower electrode contact hole 270, and a thin-film transistor contact hole 280 on the thin-film transistor are-formed using the dry etching method.

Next, an aluminum electrode is deposited to a film thickness of 500 nm, using sputtering, and then patterned.

Finally, the substrate surface is covered with resist or the like, and dry etching is used to remove the silicon film that is deposited on the rear surface, after which the resist is peeled off, thereby completing the image reading apparatus 13", as shown in FIG. 12(*m*).

It is thus possible to achieve a manufacturing process for an image reading apparatus 13" having laser exposure requiring alignment, without an increase in the number of manufacturing process steps.

Next, the laser exposure procedure used in the foregoing example is described below in detail, with references made to FIG. 13 and FIG. 14.

FIG. 13 is a plan view showing the exposure procedure for a drive circuit region, and FIG. 14 is a plan view showing the exposure procedure for an reading pixel region. First, a laser exposure alignment mark 21*a* for the drive circuit region and a laser exposure alignment mark 21*b* for the drive circuit region, and a laser exposure alignment mark 22*a* for the pixel switching element region and a laser exposure alignment mark 22*b* for the pixel switching element region are formed by a single patterning operation on the same layers as the shield layer at the positions shown in FIG. 13. Mask slits 44 are provided beforehand at positions opposite the drive circuit region 54 on the mask part 6. First, the case in which exposure is done of the drive circuit region 54 is done is described, with reference made to FIG. 13.

First, in exposing the drive circuit region 54*a*, alignment with the alignment mark 9 of the mask part 6 is performed using the drive circuit region laser exposure alignment mark 21*a* as a reference, and the substrate movement means, which is the stage 8, is caused to move as laser exposure is done, so that the mask slit 44 in the mask part 6 can be exposed from the front of the substrate of the drive circuit region.

Next, after performing alignment of the alignment mark 9 in the mask part 6 using the laser exposure alignment mark 21*b* for the drive circuit region, laser exposure is performed in the same manner.

The laser exposure procedure for the reading pixel switching element region 55 is described below, with reference to FIG. 14.

When laser exposure is done of the reading pixel switching element region 55, a mask slit 45 is provided beforehand on the mask part 6 so as to oppose the reading pixel switching element region 55.

First, alignment is done of the laser exposure part alignment mark 9 to the alignment mark 22*a* for the reading pixel switching element region, and the substrate movement means, which is the stage 8, is caused to move as laser exposure is done, so that the mask slit 45 can be exposed from the front of the substrate of the reading pixel switching element region.

Next, the laser exposure alignment mark 9 is aligned, using the laser alignment mark for the reading pixel drive circuit region 22*b* as a reference, and the stage 8 is caused to move so that the mask slit 45 can be exposed from the front of the substrate of the drive circuit region 55*b*.

In this manner, it is possible to achieve a crystalline silicon film with the desired laser exposure energy in the required region. Although in this example there are laser exposure alignment marks in three locations, as shown in FIG. 13 and FIG. 14, it will be understood that it is sufficient to have alignment marks in two locations, as long as it is possible to perform precise alignment therewith, and the number and positions of the alignment mark and number of alignment operations is not restricted.

Next, a method for manufacturing the specific example of the thin-film transistor as shown in FIG. 1(A) according to the present invention is described below, with reference to FIG. 15.

Figure 15:
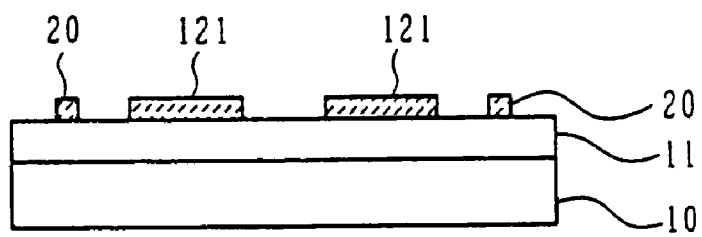
Figure 15:
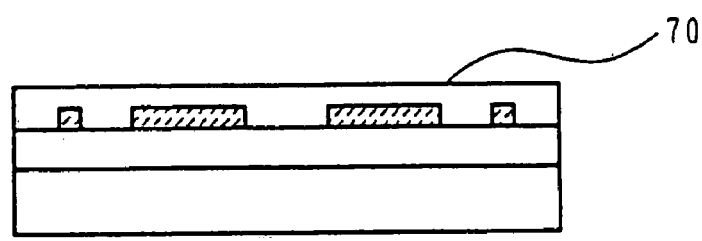
Figure 15:
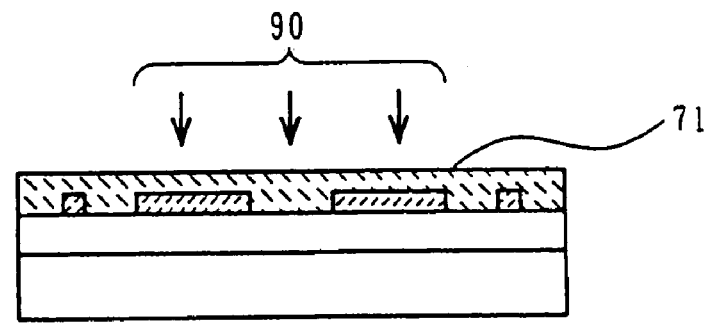
Figure 15:
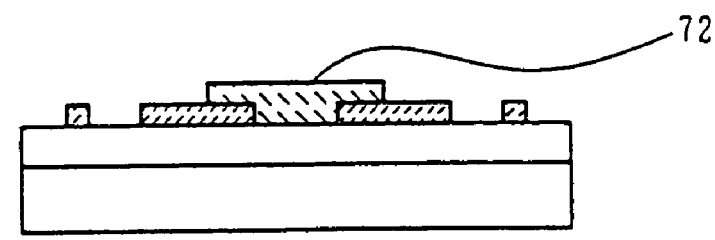
Figure 15:
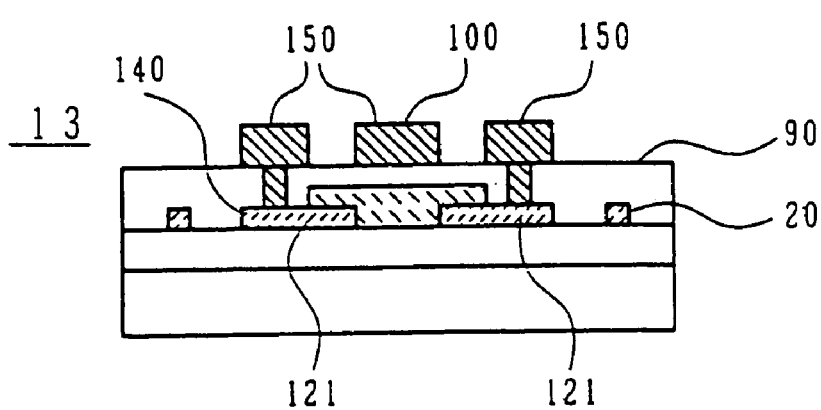

Specifically, FIG. 15 is a cross-sectional view that shows the manufacturing process steps for a forward-staggered thin-film transistor, in which method the source drain region and the laser exposure alignment mark are patterned simultaneously on one and the same layer.

First, a silicon oxide film for the purpose of protecting from contamination diffusion from the surface of the substrate is formed on a non-alkaline glass substrate 10, using reduced-pressure CVD, with silane gas ($SiH_4$) at 50 sccm, oxygen gas ($O_2$) at 500 sccm, gas flows being maintained constant within the chamber, a film-growing temperature of 400° C., and a film-growing pressure of 200 mTorr, so as to deposit a film having a thickness of 300 nm, thereby forming a cover insulation film 11.

The substrate 10 can be made of soda lime glass, or of fused silica, and the cover insulation film can be a transparent insulating material, such as silicon nitride, silicon oxynitride, or the like.

The cover insulation film can be formed by a reduced-pressure high-temperature CVD process, by a plasma CVD process using silane or oxygen or the like, by a plasma CVD process using TEOS as the raw material, or by a normal-pressure CVD process (hereinafter referred to as TEOS CVD).

Additionally, the film thickness can be deposited to a value ranging from 100 nm to approximately 1000 nm. Next, sputtering is used to deposit tungsten silicide to a thickness of 100 to 300 nm, after which a plasma CVD process is used with a gas based on hydrogen at a substrate temperature of 300° C., and a gas concentration of approximately 0.5% of phosphene ($PH_3$) at 600 sccm, and silane gas at 100 sccm introduced into a plasma CVD chamber so as to deposit an n-type semiconductor film which will serve as the impurity for the source/drain region, this film having a thickness of 50 nm.

This laminated film is patterned and, as shown in FIG. 15(*a*), the source/drain electrodes 121 and the alignment mark 20 are formed simultaneously.

In the above-noted case, although a tungsten silicide was used, it will be understood that it is possible to use a high-melting-point metal or a silicide thereof or a laminate of a high-melting-point metal and a silicide thereof.

Next, a plasma CVD process is used with silane ($SiH_4$) at 1000 sccm and hydrogen ($H_2$) at 1800 sccm, so as to deposit a film having a thickness of 100 nm at a substrate temperature of 250° C., thereby forming a silicon film 70, as shown in FIG. 15(*b*). After this process, the device is placed in a nitrogen atmosphere and annealed for 1 hour at a temperature of 400° C.

This is done because of the problem of film peeling because of separation of hydrogen in the silicon film when laser exposure is done, and has as its purpose the pre-emptive separation hydrogen included within the silicon film.

Although the above example is one in which the silicon film is formed by using a plasma CYD process, it will be understood that it is alternately possible to use a reduced-pressure CVD process or sputtering, and further that this film can be either crystalline or amorphous.

In the case in which the silicon film is formed using a reduced-pressure CYD process, diborane gas and silane gas can be used to achieve a silicon film having a desired transistor threshold value.

By doing this, it is possible to achieve p-channel and n-channel transistor characteristics that are symmetrical about the gate voltage 0 V region, and this configuration is effective with CMOS circuits.

The gas diborane/disilane concentration ratio is controlled from 0.1 to 100 ppm, by varying either one or both of diborane and disilane gas flow rates.

Next, as shown in FIG. 15(c), prescribed alignment is performed using the laser exposure alignment mark 20 as a reference, and laser exposure is performed. An XeCl (308 nm) excimer laser is used to perform laser annealing, with an exposure energy of 380 mJ/cm$^2$ (10 shots/point).

The exposure energy is different, depending upon the thickness of the silicon film, and can be selected as appropriate for the silicon film thickness, in order to achieve the required crystallization. The laser used can alternately be a KrF (248 nm) excimer laser.

Next, after forming a crystalline silicon film 71, dry etching is done to achieve an island-patterned silicon film 72 such as shown in FIG. 15(d), this layer serving as the active layer of the thin-film transistor.

Next, a plasma CVD process is used to deposit a silicon nitride film having a thickness of 300 nm, thereby forming a gate insulation film 90. The gate insulation film can alternately be formed using a reduced-pressure CVD process using silane gate and oxygen gas, a plasma CYD process using TEOS as a raw material, or a normal-pressure CYD process to form a silicon oxide film. After this is done, a contact hole 140 is formed by using drying etching. Next, after the above process steps, aluminum is sputtered to film thickness of 500 nm, and this is patterned so as to form an aluminum electrode 150. This completes the forward staggered thin-film transistor 13 as shown in FIG. 15(e).

Next, a specific example of a method for manufacturing a thin-film transistor according to the present invention is described below, with reference being made to FIG. 1(B), using the process cross-sectional views of FIG. 16.

Specifically, this example is one of a reverse staggered thin-film transistor 13, in which the gate electrode and the laser exposure alignment mark are patterned simultaneously.

Figure 16:
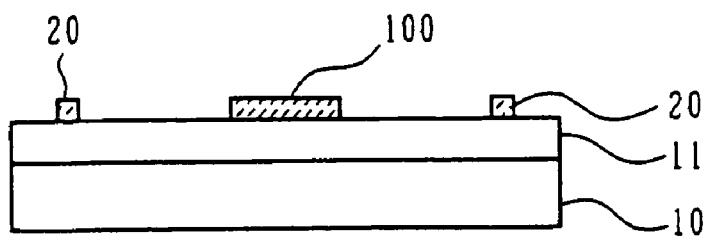
Figure 16:
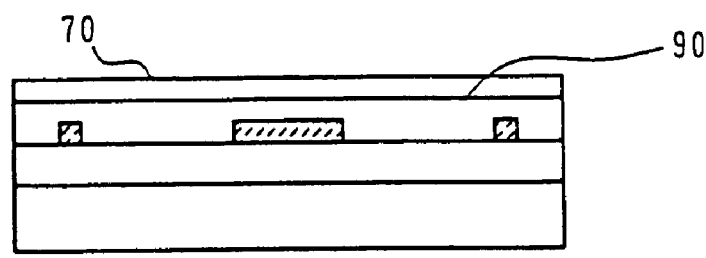
Figure 16:
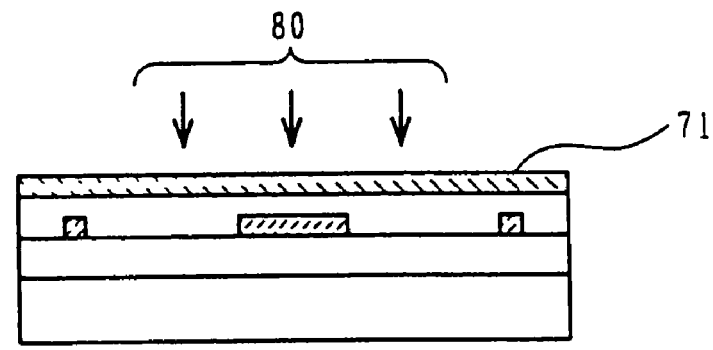
Figure 16:
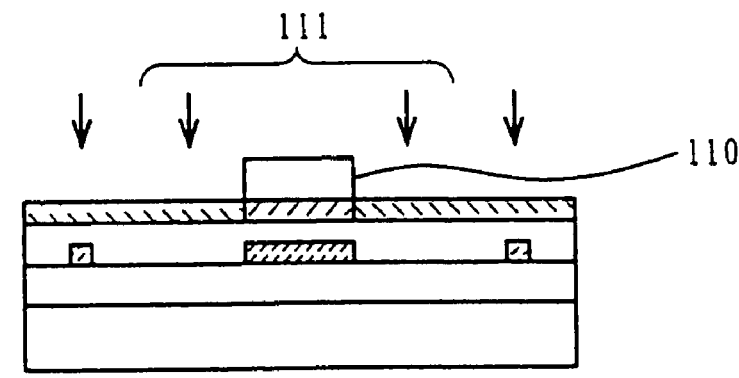
Figure 16:
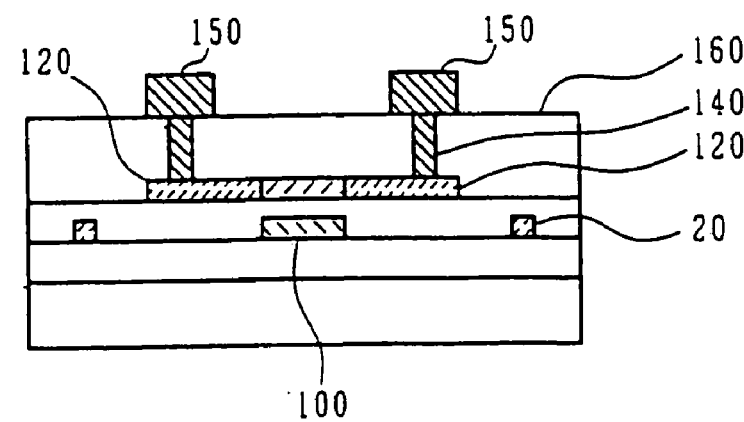

FIG. 16 is a series of cross-sectional views showing the manufacturing process steps for a reverse staggered thin-film transistor 13.

First a plasma CVD process using TEOS as the raw material is used with TEOS at 300 sccm, He at 100 sccm, O$_2$ at 6000 sccm introduced into the chamber, at a film-growing temperature of 410° C., a film-growing pressure of 170 Pa, and an RF power of 1500 W, so as to deposit onto the substrate 10 a silicon film having a thickness of 500 nm, this serving as the cover insulation film 11.

Next, a laminate of tungsten and tungsten silicide is deposited to a thickness of 150 nm, using a sputtering process, after which, as shown in FIG. 16(a), a single patterning step is performed to form not only the laser exposure alignment mark 20, but also the gate electrode 100.

If the material forming the gate electrode 100 and the laser exposure alignment mark 20 has a sufficiently low resistance to be used as a gate electrode of a reverse staggered transistor, and if the laser exposure alignment mark pattern shape enables precise alignment, it is alternately possible to use a high-melting-point metal or a silicide thereof.

Next, as shown in FIG. 16(d), a plasma CVD process is used to deposit a silicon nitride film having a thickness of 300 nm, thereby forming a gate insulation film 90, after which a plasma CVD process using silane at 300 sccm, hydrogen gas at 900 sccm, a film-growing temperature of 300° C., and an RF power of 60 W is used to deposit a silicon film to a thickness of 100 nm, thereby forming a silicon film 70.

The RF power used when depositing the silicon forms a boundary between the active layer and the gate insulation film, and is preferably kept small in order to prevent plasma damage. Next the device is placed in a nitrogen atmosphere and annealed at a temperature of 400° C. for 1 hour.

This is done because of the problem of film peeling because of separation of hydrogen in the silicon film when laser exposure is done, and has as its purpose the pre-emptive separation hydrogen included within the silicon film.

The annealing is done with a laser energy of 300 mJ/cm$^2$. The exposure energy is different, depending upon the thickness of the silicon film, and can be selected as appropriate for the silicon film thickness, in order to achieve the required crystallization.

The laser used can alternately be a KrF (248 nm) excimer laser. This crystallized silicon film 71 is used as the active layer of the reverse staggered thin-film transistor.

Next, as shown in FIG. 16(d), a mask silicon nitride film 110 serving as a mask material when introducing impurities is deposited to a thickness of 500 nm, this being patterned at the same position as the gate electrode 100. After this is done, a source/drain region for introduction of impurities is formed. Then, heat treating is done for the purpose of impurity activation.

Although this embodiment is described for the case in which impurity ions are introduced after laser exposure, it will be understood that it is alternately possible to first introduce impurity ions, and then to perform activation by laser exposure.

Next, as shown in FIG. 16(e), almost all of the masking silicon nitride film used when introducing impurity ions is removed, using a 1% to 5% dilute solution of hydrofluoric acid, after which a plasma CVD process is used to deposit a film having a thickness of 700 nm, thereby forming an interlayer insulation film 130.

Next, drying etching is used to form the contact hole 140, after which aluminum is sputtered to a thickness of 1 (m and then patterned, thereby forming the interconnect electrode 150.

The above process steps complete the reverse staggered thin-film transistor. In this manner, a method is provided for manufacturing a reverse staggered thin-film transistor having a step of laser exposure requiring alignment, without increasing the number of process steps.

Another example of the thin-film transistor 13 according to the present invention is described in detail below, with references made to FIG. 17 and FIG. 18.

First, as shown in FIG. 17(a), a plasma CVD process using TEOS as a raw material is used with TEOS at 300 sccm, He at 100 sccm, O$_2$ at 6000 sccm, a film-growing temperature of 410° C., a film-growing pressure of 170 Pa, and an RF power of 1500 watts, so as to deposit a silicon nitride film onto the substrate 10 to a thickness of 500 nm, thereby forming the cover insulation film 11.

Next, a laminate of tungsten and tungsten silicide as deposited using sputtering to a thickness of 150 nm, after which a single patterning operation is performed to form both the laser exposure alignment mark 20 and the gate electrode 100.

If the material forming the gate electrode 100 and the laser exposure alignment mark 20 has a sufficiently low resistance to be used as a gate electrode of a reverse staggered transistor, and if the laser exposure alignment mark pattern shape enables precise alignment, it is alternately possible to use a high-melting-point metal or a silicide thereof.

Figure 17:
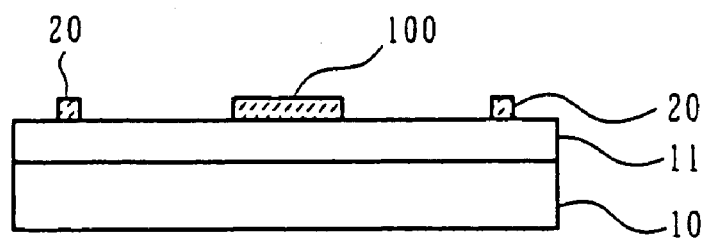
Figure 17:
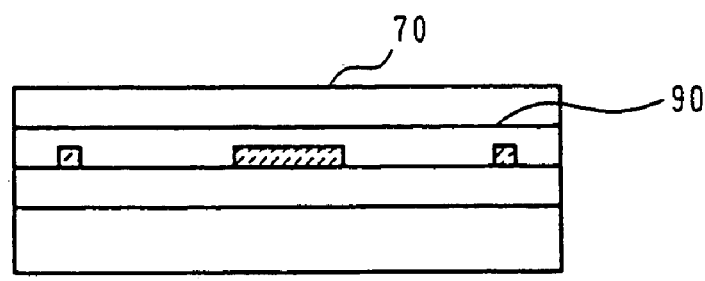
Figure 17:
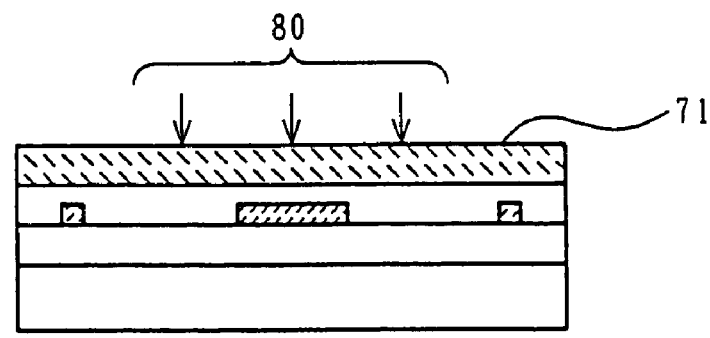
Figure 17:
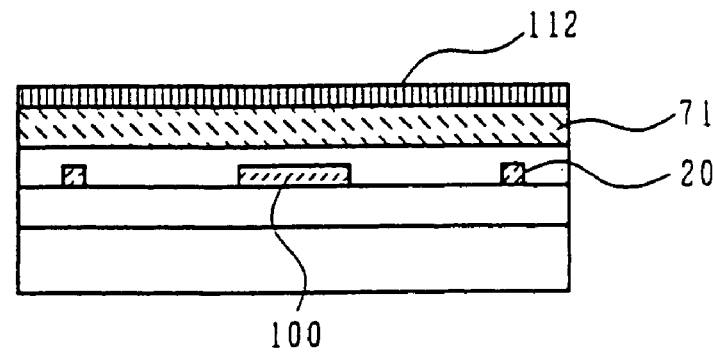

Next, as shown-in FIG. 17(*b*) a plasma CVD process is used to deposit a silicon nitride film having a thickness of 300 nm, thereby forming a gate insulation film 90, after which a plasma CVD process using silane at 300 sccm, hydrogen gas at 900 sccm, a film-growing temperature of 300° C., and an RF power of 60 W is used to deposit a silicon film that serves as the silicon film 70. When this is done, the RF power used forms a boundary between the active layer and the gate insulation film, and is preferably kept small in order to prevent plasma damage.

Next, the device is placed in a nitrogen atmosphere and annealed at a temperature of 400° C. for 1 hour.

This is done because of the problem of film peeling because of separation of hydrogen in the silicon film when laser exposure is done, and has as its purpose the pre-emptive separation hydrogen included within the silicon film.

Next, as shown in FIG. 17(*c*), alignment is done, using the laser exposure alignment mark 20 as a reference, and laser exposure 80 is performed, so as to form the crystalline silicon film 71. The laser exposure energy used to do this is 300 mJ/cm$^2$.

The exposure energy will differ depending upon the thickness of the silicon film, and can be selected as appropriate for the silicon film thickness, in order to achieve the required crystallization. The laser used can alternately be a KrF (248 nm) excimer laser.

Next, as shown in FIG. 17(*d*), a plasma CVD process is used with a gas based on hydrogen at a substrate temperature of 250° C., with 0.5% concentration phosphene gas at 500 sccm and silane gas at 200 sccm introduced into the CVD chamber, so as to deposit a film to a thickness of 50 n, thereby forming the n-type semiconductor film 112 that will serve as the source/drain impurity layer.

Figure 18:
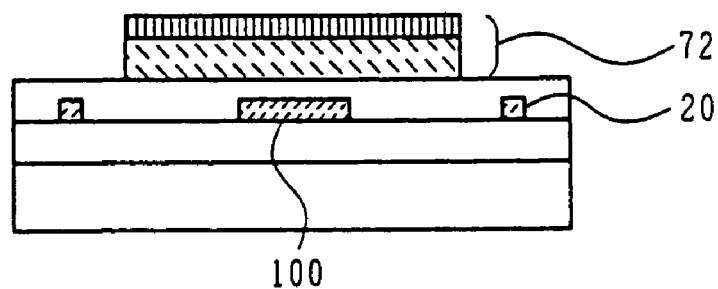
Figure 18:
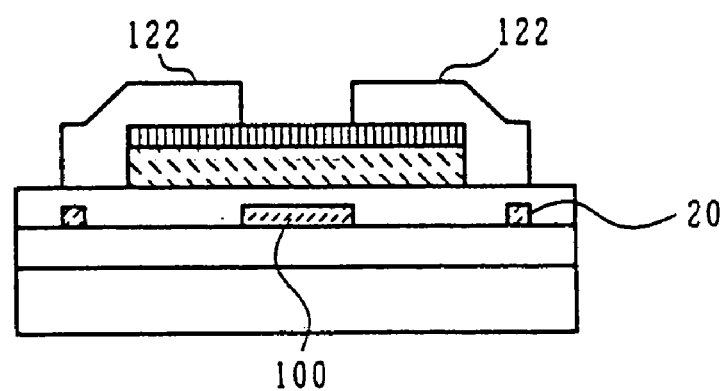
Figure 18:
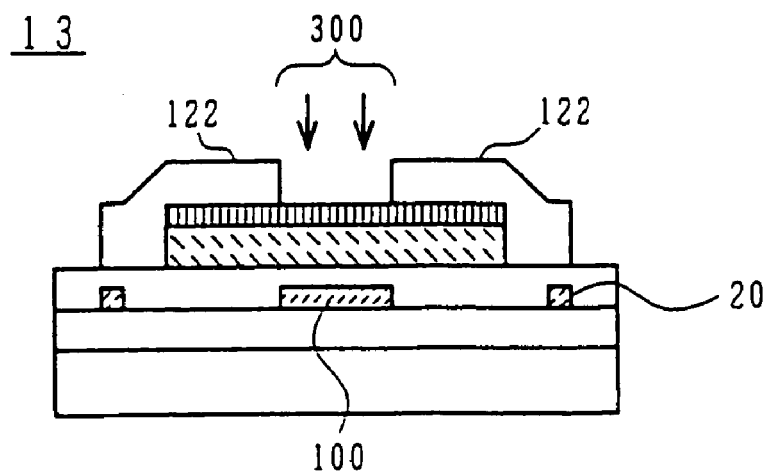

Next, as shown in FIG. 18(*e*), the crystalline silicon film 71 and the n-type silicon film 112 are dry etched to form an island-shaped silicon film 72 and, as shown in FIG. 18(*f*), chrome is sputtered to a thickness of 150 nm, after which patterning is done so as to form the source and drain electrodes 122.

After the above, as shown in FIG. 18(*g*), dry etching or the like is done so as to perform n-type layer etching 300, thereby completing the reverse staggered thin-film transistor 13.

Yet another example of a thin-film transistor according to the present invention is described in detail below, with references made to FIG. 19 and FIG. 20.

Similar to the example described above, this example is a method for manufacturing a reverse staggered thin-film transistor.

Figure 19:
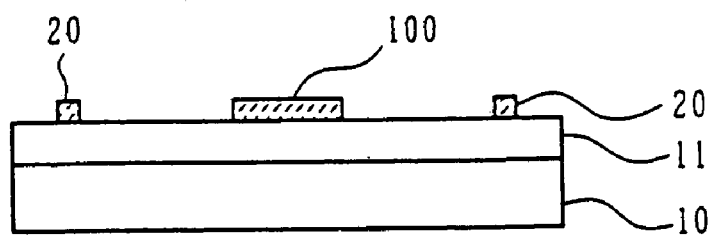
Figure 19:
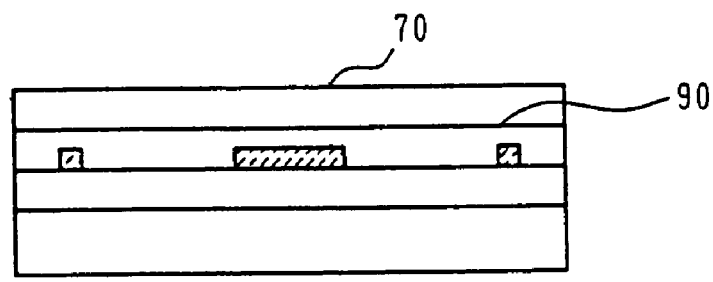
Figure 19:
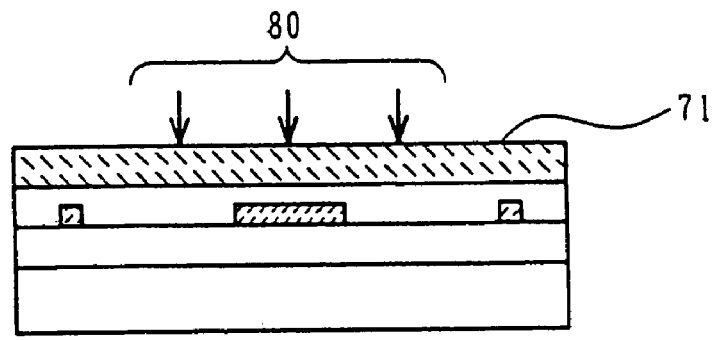
Figure 19:
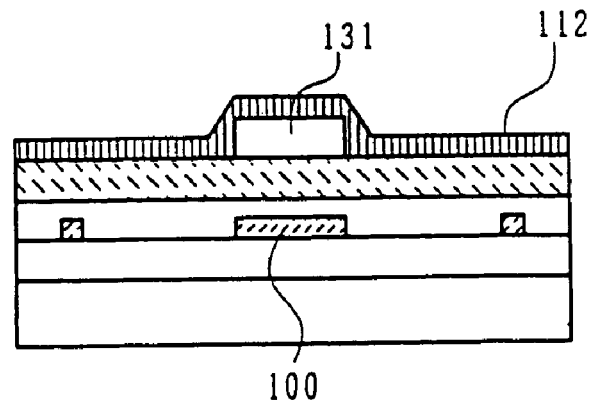

First, as shown in FIG. 19(*a*), a plasma CVD process using TEOS as the raw material is used with TEOS at 300 sccm, He at 100 sccm, O$_2$ at 6000 sccm, a film-growing temperature of 410° C., a film-growing pressure of 170 Pa, and an RF power of 1500 watts, so as to deposit a semi-conductor film to a thickness of 500 nm, thereby forming the cover insulation film 11.

Next, a laminate film of tungsten and tungsten silicide is deposited to a film thickness of 150 nm, using sputtering, and a single patterning operation is performed so as to form both the laser exposure alignment mark 20 and the gate electrode 100.

If the material forming the gate electrode 100 and the laser exposure alignment mark 20 has a sufficiently low resistance to be used as a gate electrode of a reverse staggered transistor, and if the laser exposure alignment mark pattern shape enables precise alignment, it is alternately possible to use a high-melting-point metal or a silicide thereof.

Next, as shown in FIG. 19(*b*), a plasma CVD process is used to deposit a silicon nitride film having a thickness of 300 nm, thereby forming a gate insulation film 90, after which a plasma CVD process using silane (SiH$_4$) at 300 sccm, hydrogen (H$_2$) gas at 900 sccm, a film-growing temperature of 300° C., and an RF power of 60 W is used to deposit a silicon film to a thickness of 100 nm, thereby forming a silicon film 70.

The RF power used when depositing the silicon forms a boundary between the active layer and the gate insulation film, and is preferably kept small in order to prevent plasma damage.

Next the device is placed in a nitrogen atmosphere and annealed at a temperature of 400° C. for 1 hour.

This is done because of the problem of film peeling because of separation of hydrogen in the silicon film when laser exposure is done, and has as its purpose the pre-emptive separation hydrogen included within the silicon film.

Next, as shown in FIG. 19(*c*), alignment is done using the laser exposure alignment mark 20 as a reference, and laser exposure 80 is performed, thereby forming the crystalline silicon film 71.

The annealing is done with a laser energy of 300 mJ/cm$^2$. The exposure energy is different, depending upon the thickness of the silicon film, and can be selected as appropriate for the silicon film thickness, in order to achieve the required crystallization.

The laser used can alternately be a KrF (248 nm) excimer laser. This crystallized silicon film 71 is used as the active layer of the reverse staggered thin-film transistor.

Next, as shown in FIG. 19(*d*), for the purpose of protecting the region that will serve as the channel region, a plasma CVD process is sued to deposit a silicon nitride film to a thickness of 500 nm, which is then patterned, after which the channel protective layer 131 is formed. After this is done, a plasma CVD process is used to form an n-type silicon film 112.

Figure 20:
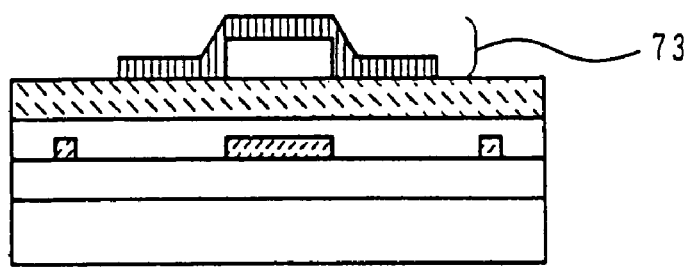
Figure 20:
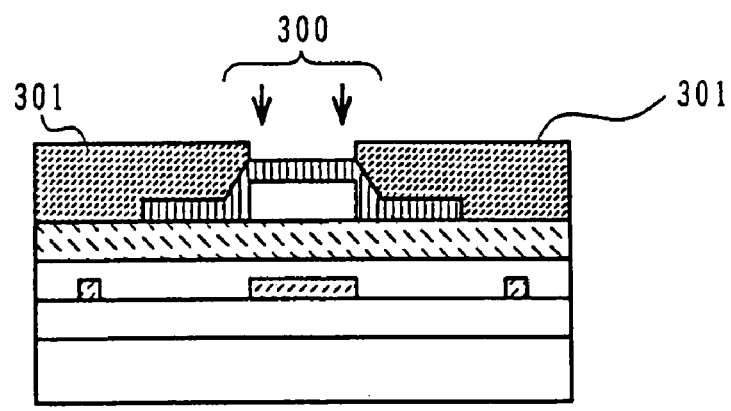
Figure 20:
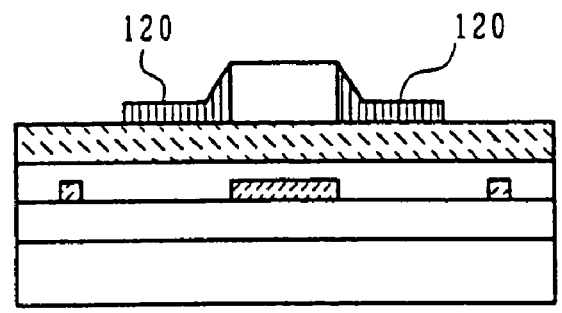
Figure 20:
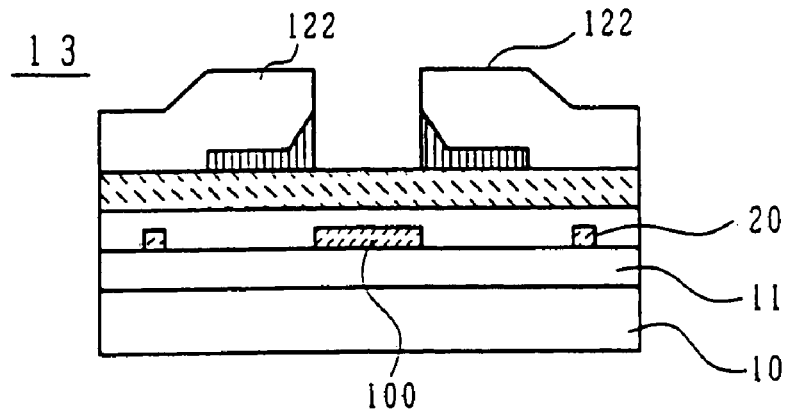

Next, as shown in FIG. 20(*e*), the crystalline silicon film 71, the channel protective layer 131, and the n-type silicon film 112 are patterned by dry etching, so as to formation island-shaped silicon film 73.

Next, as shown in FIG. 20(*f*), after forming an appropriate resist film 301, dry etching is done to perform etching 300 of the n-type silicon film and, as shown in FIG. 20(*g*), the n-type silicon film is separated, so as to form the source and-drain regions 120, while-simultaneously removing the resist film 301.

Next, as shown in FIG. 20(*f*), sputtering is done to deposit chrome or the like, after which this is patterned, so as to form the source and drain electrodes 122, thereby completing the reverse staggered thin-film transistor 13.

Figure 21:
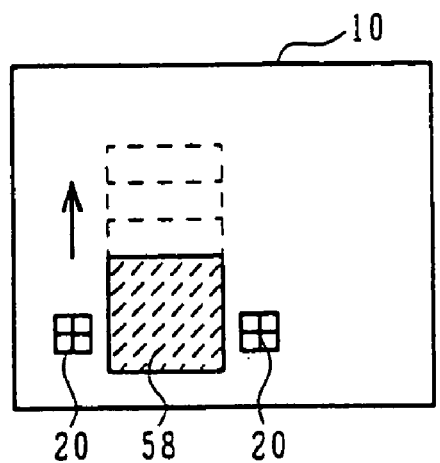
Figure 21:
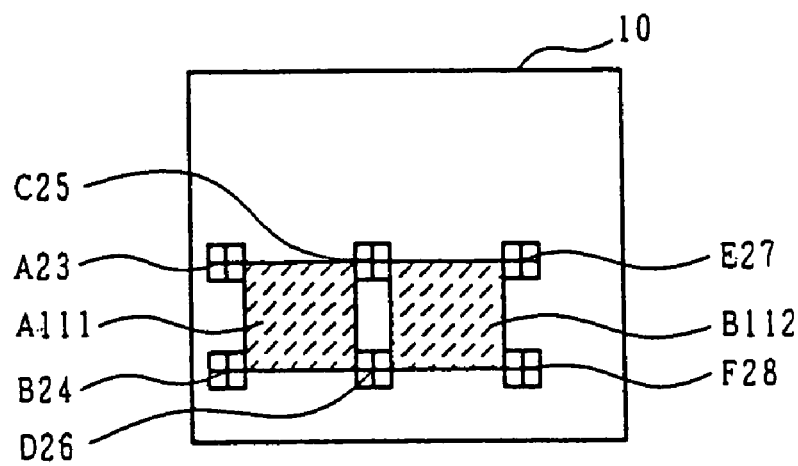

In the above-noted example of the present invention, as shown in FIG. 21(*a*), it is possible to use an appropriate drive means to move either a stage 1, a mask part 6 or both of these elements, so as to perform scanning while superposing the exposure regions.

The above is called block exposure, and can be achieve alternately by a method of exposure the same region on the substrate from several times to several tens of times with the exposure energy.

For example, as shown in FIG. 21(*b*), in the case in which the bock exposure region is rectangular, laser exposure alignment marks are provided at the four corners thereof, and a laser exposure part alignment mark is provided in corresponding positions at positions corresponding to the mask slit part side.

If exposure is made onto the block exposure region A111, the four laser exposure alignment marks A23, B24, C25, and D26 are used for alignment, and if exposure is made onto the block exposure region B112, the four laser exposure alignment marks C25, D26, E27, and F28 are used for alignment.

In the method of block exposure, it is possible to increase the number of exposures, so as to improve the effective exposure intensity, this being advantageous in improving the characteristics of the thin-film transistor. This method is suitable for local exposure of small regions, and is an effective means for use when it is desired to achieve a high-performance thin-film transistor in a small region.

When laser light exposure is done, however, the distribution of the optics system is directly reflected in a specific region, thereby influencing the silicon crystallization. For this reason, it is necessary to take care with regard to the optics system-design and exposure conditions.

The scanning exposure method has the advantage of applicability to large areas to be exposed. Making use of these characteristics, it is possible to combine a region 58, in which the scanning exposure method is used, with regions 56 and 57, in which the block exposure method is used, and to select the exposure method suited to a particular purpose.

As is clear from the detailed description of the embodiments of the present invention presented above, a method for manufacturing a thin-film transistor according to the present invention is a method using an apparatus having a light source, a mask means for forming a light beam emitted from a light source into a prescribed shape and forming a light path directing the thusly shaped beam in a prescribed direction, and a substrate movement means onto which a substrate including a semiconductor device constituent part rests, movable so as to cause a prescribed location of the semiconductor device constituent part to oppose the light path, whereby an operation positioning of the prescribed light path in the masking means with the prescribed location on the semiconductor device constituent part is performed by referencing an alignment mark provided on the semiconductor device constituent part.

In this method, it is preferable that control be performed so that an alignment mark detection means provided in the mask means is aligned with the alignment mark provide in the semiconductor device constituent part when performing the operation of positioning the desired light path in the mask means with a desired location of the constituent part of the semiconductor device in the substrate movement means.

Additionally, in a method for manufacturing a thin-film transistor according to the present invention, it is desirable that the mask means has one or more mask patterns for the purpose of forming one or more formed light beams having a cross-sectional area smaller than the cross-sectional area of a light beam emitted from the, light source, and it is further desirable that an operation of aligning a desired light path in the mask means with a desired location on the semiconductor device constituent part in the substrate movement means be performed by referencing an alignment mark provided in the semiconductor device constituent part of the substrate.

More specifically, the operation of aligning a desired light path in the mask means with a desired location on the semiconductor device constituent part in the substrate movement means is achieved by performing control so that an alignment mark provided in the semiconductor device constituent part on the substrate is aligned with an alignment mark provided in the mask means.

In a process for manufacturing a thin-film transistor requiring laser exposure for the purpose of locally crystallizing a semiconductor layer, or a process for manufacturing an electronic apparatus using such a thin-film transistor, it is possible with the present invention to achieve high-throughput manufacturing without an increase in the number of process steps.

What is claimed is:

1. An apparatus for manufacturing a thin-film transistor, comprising:

a light source means;

a mask means for forming a light beam emitted from said light source means into a prescribed shape and forming a light path directina the shaped beam in a prescribed direction; and a substrate movement means onto which a substrate including a semiconductor device constituent part rests, movable so as to cause a prescribed location of said semiconductor device constituent part to oppose the light path, wherein said mask means comprises an alignment mark detection means for detecting an alignment mark provided on said semiconductor device constituent part, and wherein said alignment mark detection means of said mask means further comprises means for image processing.

2. An apparatus for manufacturing a thin-film transistor, comprising:

a light source means;

a mask means for forming a light beam emitted from said light source means into a prescribed shape and forming a light path directing the shaped beam in a prescribed direction; and a substrate movement means onto which a substrate including a semiconductor device constituent part rests, movable so as to cause a prescribed location of said semiconductor device constituent part to oppose the light path, wherein said mask means comprises an alignment mark detection means for detecting an alignment mark provided on said semiconductor device constituent part, and wherein an operation of aligning a desired light path in said mask means with a desired location in said semiconductor device constituent part is performed by performing control so that an alignment mark provided in said mask means coincides with an alignment mark detecting means provided in said semiconductor device constituent part.

3. An apparatus for manufacturing a thin-film transistor, further comprising:

a light source means;

a mask means for forming a light beam emitted from said light source means into a prescribed shape and forming a light path directing the shaped beam in a prescribed direction;

a substrate movement means onto which a substrate including a semiconductor device constituent part rests, movable so as to cause a prescribed location of said semiconductor device constituent part to oppose the light path; and a control means connected to said substrate movement means, and performing control so that said alignment mark detection means provided in said mask means coincides with said alignment mark provided in said semiconductor device constituent part, wherein said mask means comprises an alignment mark detection means for detecting an alignment mark provided on said semiconductor device constituent part.

4. An apparatus for manufacturing a thin-film transistor according to claim 1, wherein said mask means comprises one or more mask patterns for forming one or more formed light beams having a cross-sectional area smaller than a cross-sectional area of a light beam emitted from said light source means.

5. An apparatus for manufacturing a thin-film transistor according to claim 1, wherein said mask means comprises one or more mask patterns for forming one or more formed light beams having a cross-sectional area smaller than a cross-sectional area of a light beam emitted from said light source.

6. An apparatus for manufacturing a thin-film transistor according to claim 1, wherein an operation of aligning a desired light path in said mask means with a desired location on said semiconductor device constituent part is performed by referencing an alignment mark provided on said substrate.

7. An apparatus for manufacturing a thin-film transistor according to claim 1, wherein said alignment mark formed at a desired location on said semiconductor device constituent part is formed simultaneously with another constituent part in a process step in which said semiconductor device is manufactured.

* * * * *